(12) United States Patent
Niikura et al.

(10) Patent No.: US 12,199,602 B2
(45) Date of Patent: Jan. 14, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yuichiro Niikura, Kamakura Kanagawa (JP); Hitoshi Imai, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/457,972

(22) Filed: Aug. 29, 2023

(65) Prior Publication Data

US 2024/0146302 A1    May 2, 2024

(30) Foreign Application Priority Data

Oct. 27, 2022   (JP) ................. 2022-172124

(51) Int. Cl.
  *H03K 17/785*  (2006.01)
  *H01L 25/075*  (2006.01)
  *H01L 25/16*   (2023.01)
  *H01L 33/38*   (2010.01)
  *H01L 33/62*   (2010.01)

(52) U.S. Cl.
  CPC ....... *H03K 17/785* (2013.01); *H01L 25/0753* (2013.01); *H01L 25/167* (2013.01); *H01L 33/382* (2013.01); *H01L 33/62* (2013.01)

(58) Field of Classification Search
  CPC . H03K 17/785; H01L 25/0753; H01L 25/167; H01L 33/382; H01L 33/62
  See application file for complete search history.

(56) References Cited

U.S. PATENT DOCUMENTS

| | | | |
|---|---|---|---|
| 6,806,457 B2 | 10/2004 | Yang | |
| 2012/0326292 A1* | 12/2012 | Ohashi | H01L 23/3677 257/690 |
| 2015/0303180 A1* | 10/2015 | Noguchi | H01L 25/167 257/82 |
| 2017/0176519 A1* | 6/2017 | Takai | H01L 22/34 |
| 2022/0190270 A1* | 6/2022 | Onoya | H10K 50/00 |

FOREIGN PATENT DOCUMENTS

| | | |
|---|---|---|
| JP | 2004-179244 A | 6/2004 |
| JP | 2010-028711 A | 2/2010 |
| JP | 2019-021959 A | 2/2019 |

* cited by examiner

*Primary Examiner* — Thanh Luu
*Assistant Examiner* — Monica T Taba
(74) *Attorney, Agent, or Firm* — Kim & Stewart LLP

(57) ABSTRACT

According to one embodiment, a semiconductor device includes a substrate; a first transistor, a second transistor, a third transistor, and a fourth transistor; a first light emitting element and a second light emitting element; a first light receiving element configured to switch the first transistor and the second transistor to an ON state or to an OFF state; and a second light receiving element configured to switch the third transistor and the fourth transistor to the ON state or to the OFF state, wherein the first light emitting element and the second light emitting element are configured such that, when either one of the first light emitting element or the second light emitting element is turned to a lit state, the other one is turned to an unlit state.

16 Claims, 11 Drawing Sheets

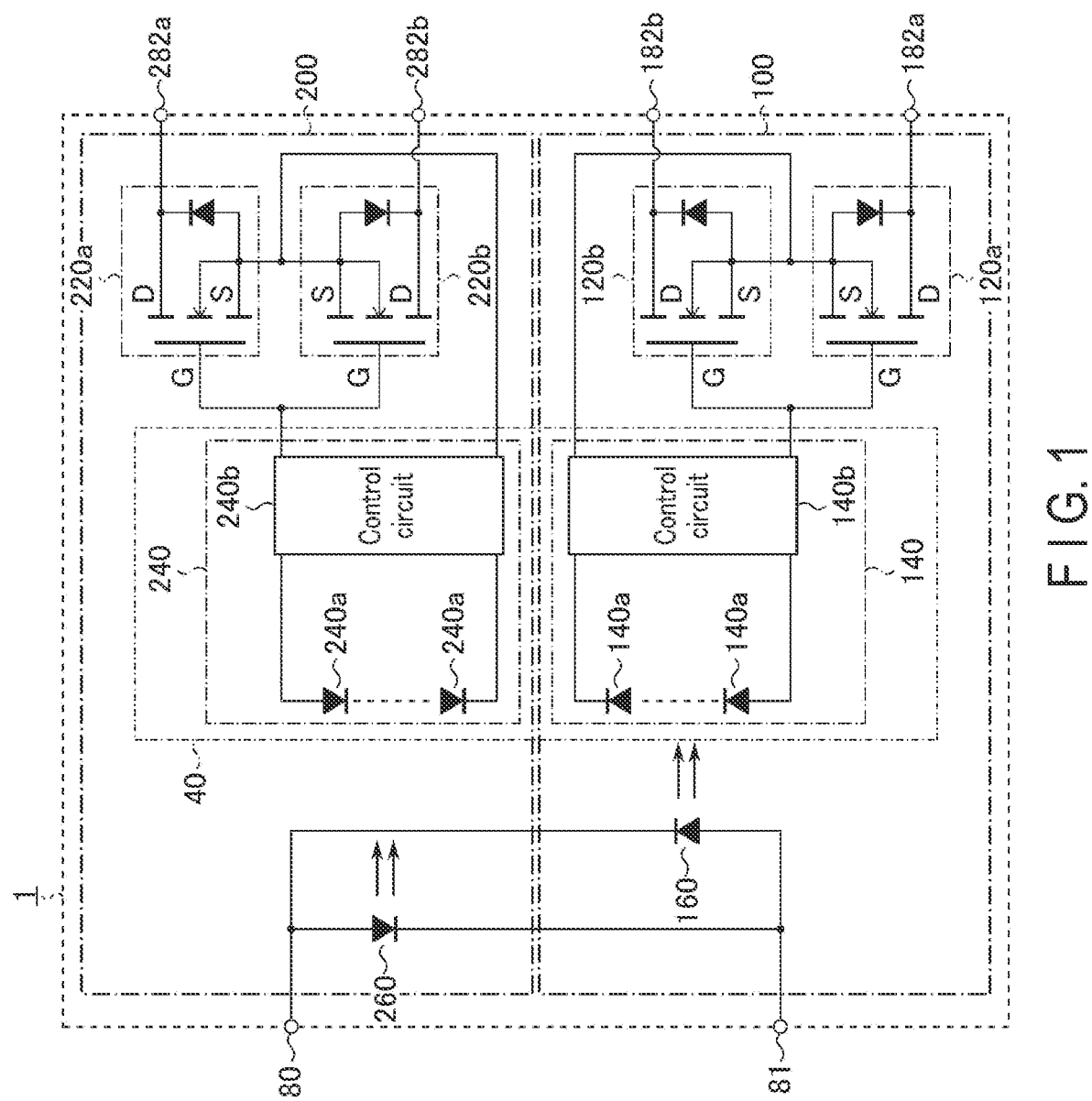
F I G. 1

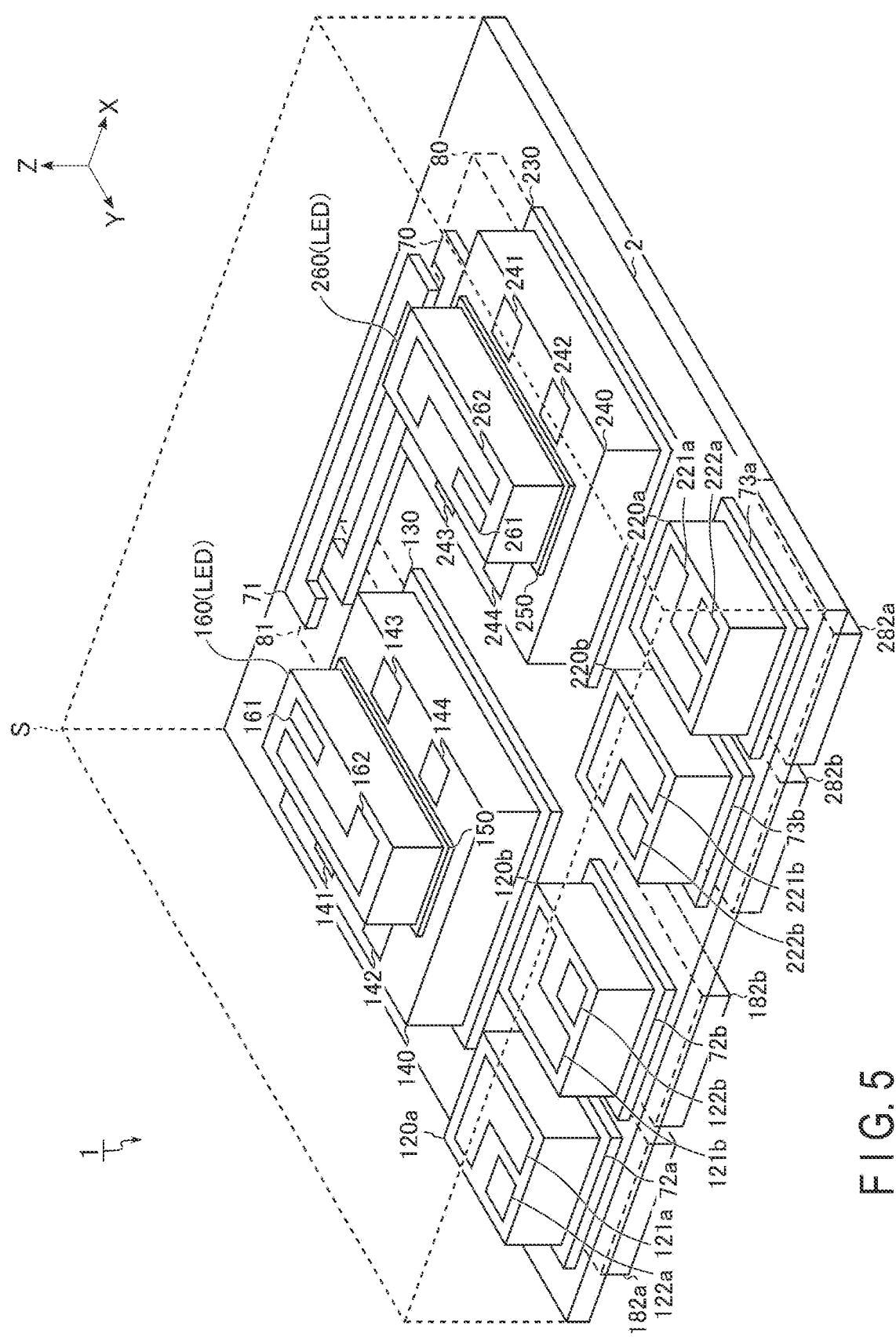
F I G. 5

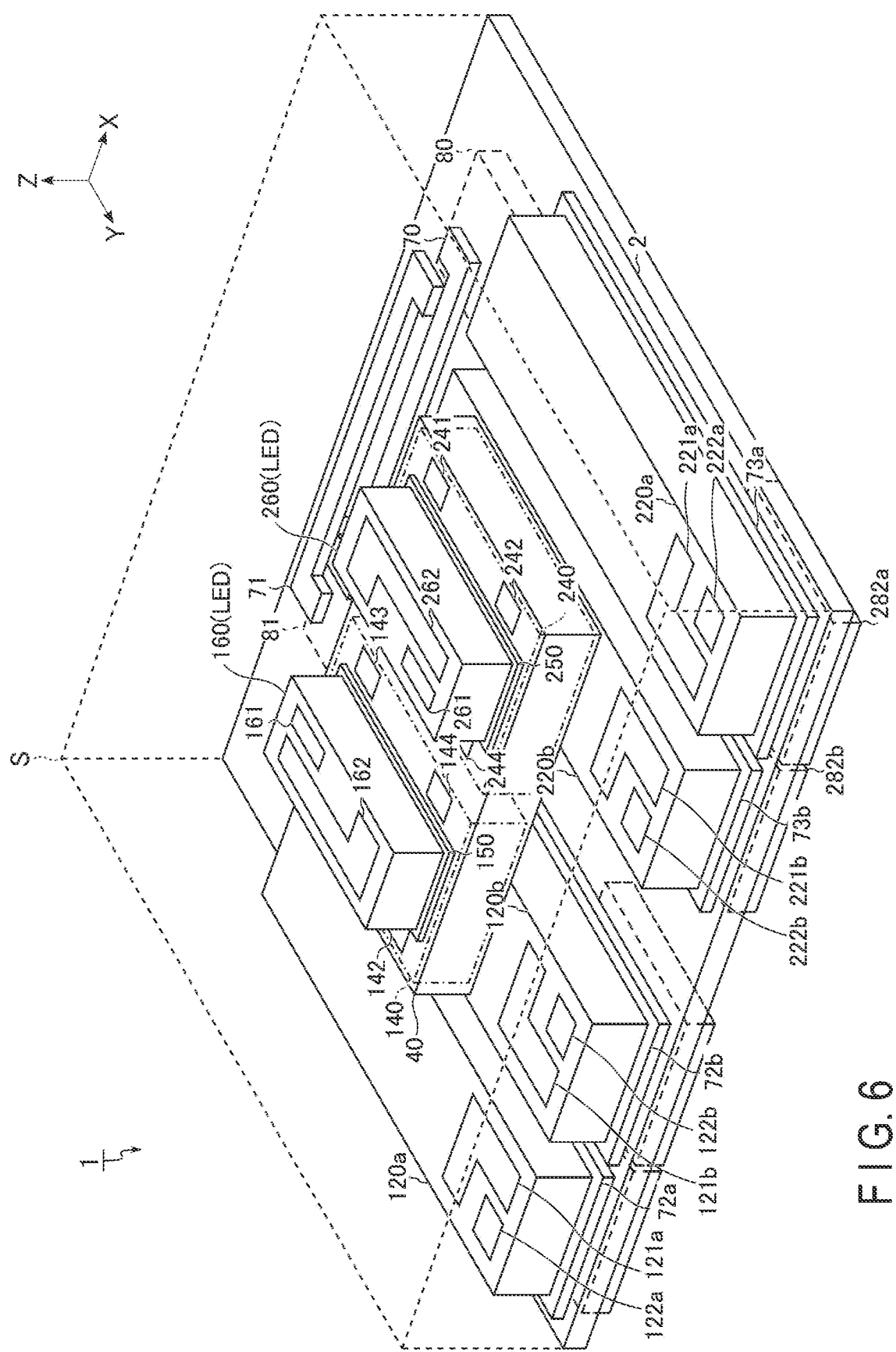
F I G. 6

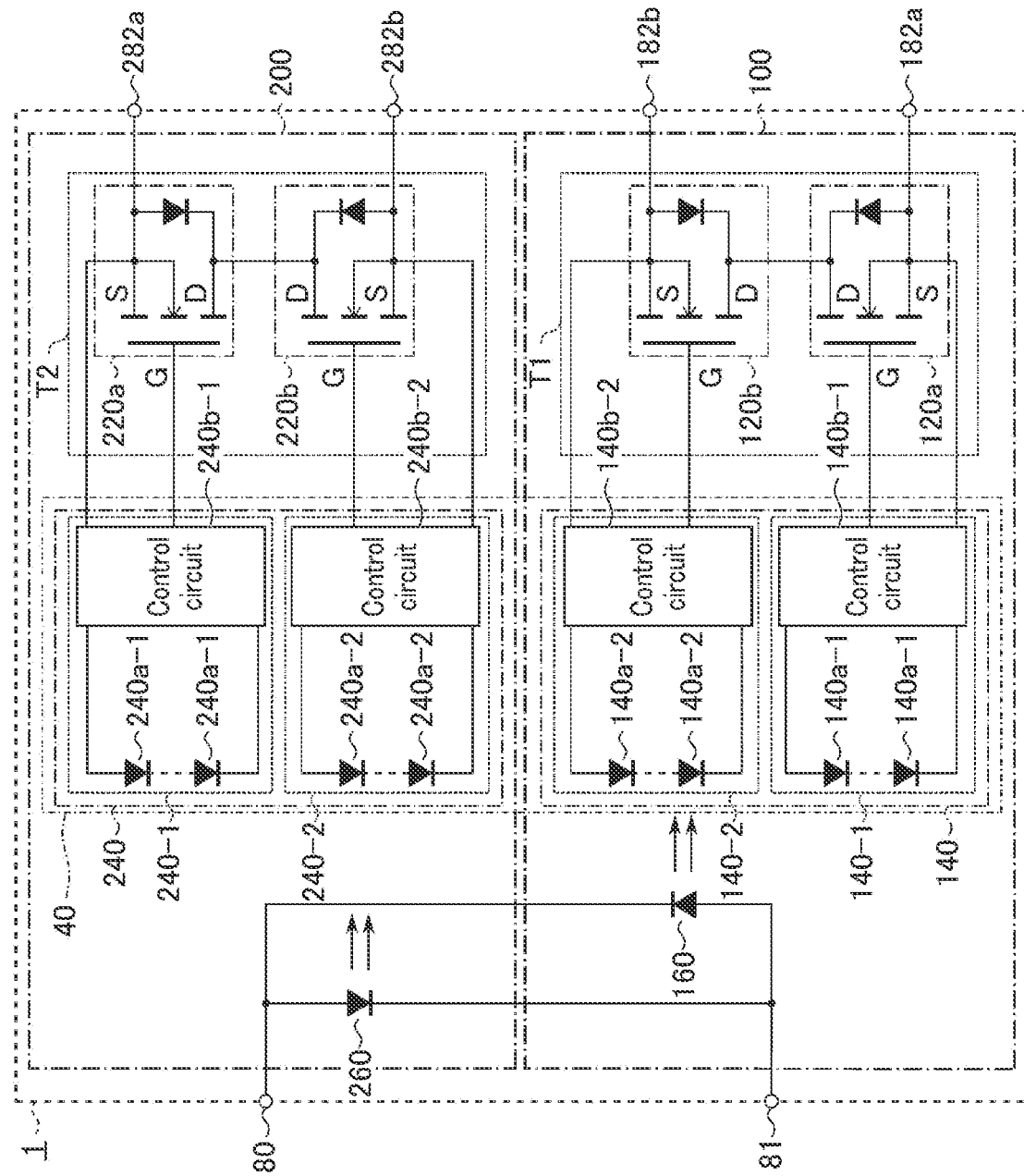
F I G. 8

SEMICONDUCTOR DEVICE

CROSS-REFERENCE TO RELATED APPLICATIONS

This application is based upon and claims the benefit of priority from Japanese Patent Application No. 2022-172124, filed Oct. 27, 2022, the entire contents of which are incorporated herein by reference.

FIELD

Embodiments described herein relate generally to a semiconductor device.

BACKGROUND

As a semiconductor device, a drive device provided with multiple relay units has been known. Each of the relay units includes a light emitting element and a light receiving element. These relay units are contactless, and are used for transmission of alternating-current signals and direct-current signals.

BRIEF DESCRIPTION OF THE DRAWINGS

FIG. 1 is a circuit diagram for showing an exemplary circuit configuration of a semiconductor device according to an embodiment.

FIG. 5 is a perspective diagram showing an exemplary configuration of a semiconductor device according to the first modification example.

FIG. 6 is a perspective diagram showing an exemplary configuration of a semiconductor device according to the second modification example.

FIG. 8 is a circuit diagram showing an exemplary circuit configuration of a semiconductor device according to the fourth modification example.

DETAILED DESCRIPTION

Figure 2:
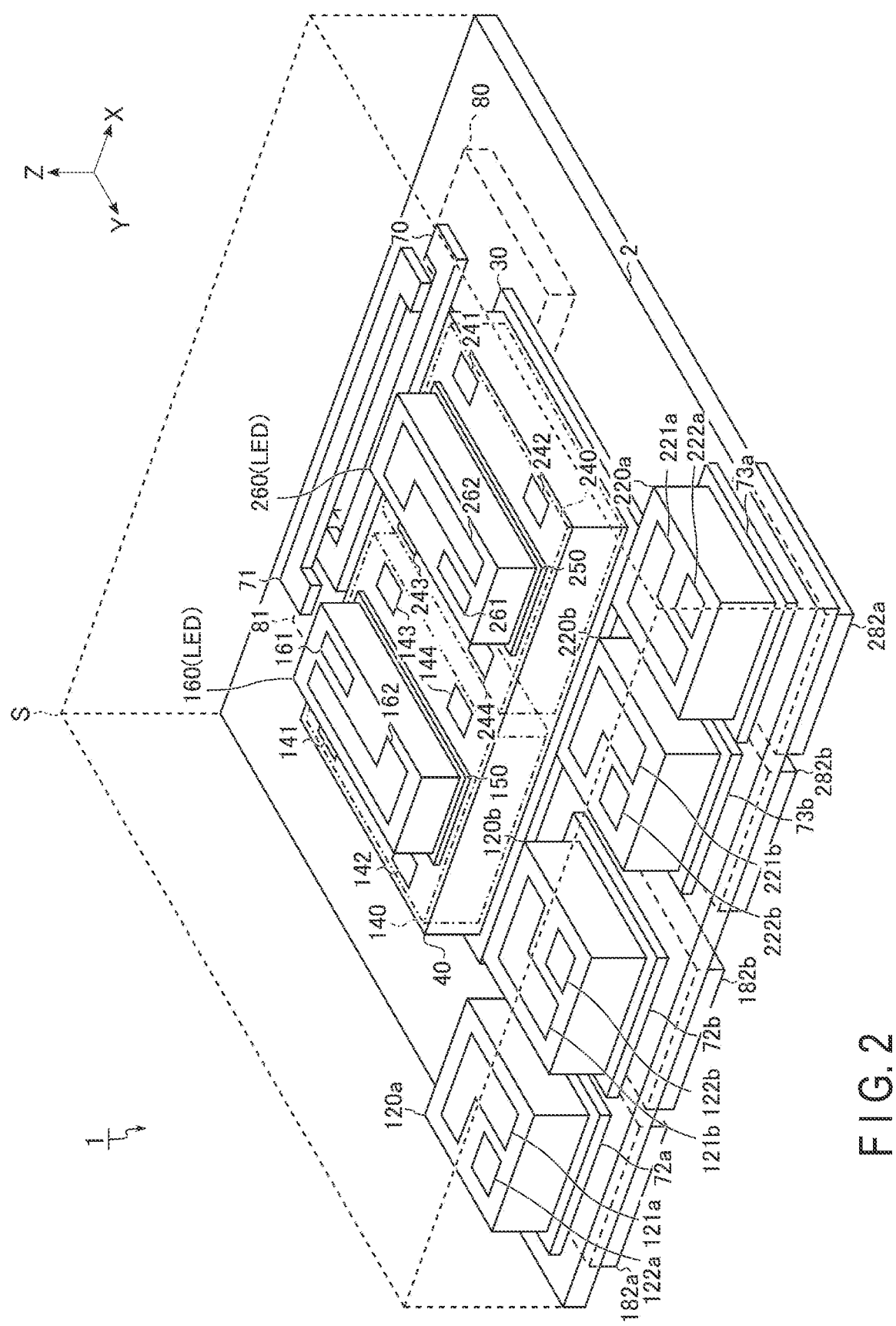
FIG. 2 is a perspective diagram showing an exemplary configuration of the semiconductor device according to the embodiment.

In general, according to one embodiment, a semiconductor device includes a substrate; a first transistor, a second transistor, a third transistor, and a fourth transistor arranged in contact with a first surface of the substrate; a first light emitting element and a second light emitting element each arranged above the first surface of the substrate; a first light receiving element arranged between the first surface of the substrate and the first light emitting element and configured to switch the first transistor and the second transistor to an ON state or to an OFF state in accordance with an emission state of the first light emitting element; and a second light receiving element arranged between the first surface of the substrate and the second light emitting element and configured to switch the third transistor and the fourth transistor to the ON state or to the OFF state in accordance with an emission state of the second light emitting element, wherein the first light emitting element and the second light emitting element are configured such that, when either one of the first light emitting element or the second light emitting element is turned to a lit state, the other one is turned to an unlit state.

The embodiments will be described below with reference to the drawings. In the description, structural components having the same functions and structures will be given the same reference numerals. Dimensions and proportions of the drawings may not correspond to the actual dimensions and proportions.

1. EMBODIMENT

A semiconductor device according to one embodiment will be described.

The semiconductor device according to the embodiment is a drive device, which includes two relay units. Each of the relay units may control the transmission states of alternating-current signals and direct-current signals. The semiconductor device according to this embodiment is a package of electronic components. In the description below, the alternating-current signals and direct-current signals may also be referred to simply as "signals".

An exemplary configuration of the semiconductor device according to the embodiment will be described by referring to FIG. 1. In this drawing, a circuit diagram of an exemplary configuration of the semiconductor device according to the embodiment is shown.

The semiconductor device 1 includes terminals 80, 81, 182a, 182b, 282a, and 282b.

Signals for driving the semiconductor device 1 are transmitted between the terminals 80 and 81. While the semiconductor device 1 is being driven, signals are transmitted via the terminals 182a and 182b or via the terminals 282a and 282b in the semiconductor device 1.

FIG. 1 continues to be referred to for the exemplary circuit configuration of the semiconductor device 1 according to the embodiment.

The semiconductor device 1 further includes metal-oxide-semiconductor field effect transistors (MOSFETs) 120a, 120b, 220a, and 220b; a light receiving unit 40; and light emitting elements 160 and 260. The light receiving unit 40 includes light receiving elements 140 and 240. The MOSFETs 120a, 120b, 220a, and 220b may be enhancement-mode N-channel MOSFETs. The light receiving elements 140 and 240 may be sensors each including a photo diode array (PDA) or photo transistor. In the following description, light receiving elements 140 and 240 including a PDA will be discussed. The light emitting elements 160 and 260 may be light emitting diodes (LED).

In the above configuration, the MOSFETs 120a and 120b, the light receiving element 140, and the light emitting element 160 are included in the relay unit 100. The MOSFETs 220a and 220b, the light receiving element 240, and the light emitting element 260 are included in the relay unit 200.

The circuit configuration of the relay unit 100 will be described.

The light emitting element 160 is coupled to the terminals 80 and 81. In particular, the cathode electrode of the light emitting element 160 may be coupled to the terminal 80, and the anode electrode of the light emitting element 160 may be coupled to the terminal 81. The light emitting element 160 is driven by a signal transmitted between the terminals 80 and 81. The emission state of the light emitting element 160 is thereby switched between the ON state (lit state) and OFF state (unlit state).

The light receiving element 140 includes multiple photodiodes 140a that are serially connected and a control circuit 140b. The number of photodiodes 140a may be more than one and less than a hundred. The two ends of the serially connected photodiodes 140a are both coupled to the control circuit 140b. The control circuit 140b turns the MOSFETs 120a and 120b to the ON state with the photovoltaic power generated by the photodiodes 140a.

The gate of the MOSFET 120a and the gate of the MOSFET 120b are commonly coupled to the anode electrode of the control circuit 140b. The source of the MOSFET 120a and the source of the MOSFET 120b are commonly coupled to the cathode electrode of the control circuit 140b. The drain of the MOSFET 120a is coupled to the terminal 182a, and the drain of the MOSFET 120b is coupled to the terminal 182b.

In the relay unit 100, when the light emitting element 160 is turned from the OFF state to the ON state, light is emitted from the light emitting element 160. The light receiving element 140 uses the voltage generated from the photovoltaic effect to supply a charging current to the gates of the MOSFETs 120a and 120b. As a result, the MOSFETs 120a and 120b turn from the OFF state to the ON state, electrically connecting the terminals 182a and 182b to each other.

In this manner, the relay unit 100 transmits a signal supplied to either one of the terminals 182a and 182b, to the other one of the terminals 182a and 182b via the MOSFETs 120a and 120b.

When the light emitting element 160 turns from the ON state to the OFF state, the light emission from the light emitting element 160 to the light receiving element 140 is terminated. The MOSFETs 120a and 120b are thereby turned from the ON state to the OFF state. In this manner, the relay unit 100 shuts off the electrical connection between the terminals 182a and 182b.

The circuit configuration of the relay unit 200 will be described next.

The light emitting element 260 is coupled to the terminals 80 and 81. In particular, the anode electrode of the light emitting element 260 may be connected to the terminal 80, and the cathode electrode of the light emitting element 260 may be connected to the terminal 81. In a manner similar to the light emitting element 160, the light emitting element 260 is driven by signals transmitted between the terminals 80 and 81. The emission state of the light emitting element 260 is thereby switched between the ON state and OFF state.

With the above configuration, the light emitting elements 160 and 260 are mutually connected in an antiparallel manner.

The light receiving element 240 includes multiple photodiodes 240a that are serially connected and a control circuit 240b. The number of photodiodes 240a may be more than one and less than a hundred. The two ends of the serially connected photodiodes 240a are both coupled to the control circuit 240b. The control circuit 240b turns the MOSFETs 220a and 220b to the ON state with the photovoltaic power generated by the multiple photodiodes 240a.

The gate of the MOSFET 220a and the gate of the MOSFET 220b are commonly coupled to the anode electrode of the control circuit 240b. The source of the MOSFET 220a and the source of the MOSFET 220b are commonly coupled to the cathode electrode of the control circuit 240b. The drain of the MOSFET 220a is coupled to the terminal 282a, and the drain of the MOSFET 220b is coupled to the terminal 282b.

In the relay unit 200, when the light emitting element 260 is tuned from the OFF state to the ON state, light is emitted from the light emitting element 260. The light receiving element 240 uses the voltage generated from the photovoltaic effect to supply a charging current to the gates of the MOSFETs 220a and 220b. As a result, the MOSFETs 220a and 220b turn from the OFF state to the ON state, electrically connecting the terminals 282a and 282b to each other.

In this manner, the relay unit 200 transmits a signal supplied to either one of the terminals 282a and 282b, to the other one of the terminals 282a and 282b via the MOSFETs 220a and 220b.

When the light emitting element 260 turns from the ON state to the OFF state, the light emission from the light emitting element 260 upon the light receiving element 240 is terminated. This turns the MOSFETs 220a and 220b from the ON state to the OFF state. In this manner, the relay unit 200 shuts off the electrical connection between the terminals 282a and 282b.

As discussed above, a relay unit is in a signal transmittable state when two terminals coupled to the drains of the two corresponding MOSFETs of the relay unit are electrically connected to each other. In the following description, a relay unit in such a state will be referred to as an active relay unit. The two MOSFETs in an active relay unit are in the ON state. On the other hand, when the two terminals coupled to the drains of the two MOSFETs are electrically shut off, the relay unit is in a signal non-transmittable state. A relay unit in such a state will be referred to as an inactive relay unit. The two MOSFETs in the inactive relay unit are in the OFF state.

With a current supplied between the terminals 80 and 81, the semiconductor device 1 turns one of the mutually antiparallel-connected light emitting elements 160 and 260 to the ON state and the other to the OFF state. In this manner, when a current is supplied between the terminals 80 and 81, the semiconductor device 1 turns one of the relay units 100 and 200 to the active state and the other relay unit to the inactive state.

The semiconductor device 1, which switches the active state between the two relay units by switching the ON state between the light emitting elements, can prevent these relay units from both turning to the active state at the same time. In particular, in the semiconductor device 1, the turn-on start time period from the start of a charging-current supply to an OFF-state MOSFET to the start of turning this MOSFET to the ON state takes longer than the turn-off time period from the start of discharging at the gate of an ON-state MOSFET to the timing of turning this MOSFET to the OFF state. In the switching of active relay units, an inactive relay unit will therefore turn to the active state only after an active relay unit turns to the inactive state. Here, in the switching of active relay units, the time period from the timing of one relay unit turning from the active to inactive state to the timing of the other relay unit starting to change from the inactive to active state will be referred to as a "dead time". That is, in the dead time in the switching of active relay units, two relay units are both in the inactive state. By ensuring this dead time in the switching of active relay units, the two relay units can be prevented from both becoming active.

Next, the configuration of the semiconductor device 1 according to the embodiment will be described with reference to FIG. 2. A perspective diagram for an exemplary configuration of the semiconductor device 1 according to the embodiment is presented in this drawing. In the following description, the Z direction corresponds to a direction perpendicular to the surface of the substrate on which the semiconductor device 1 is formed. The X direction is a direction parallel to the surface of this substrate, and the Y direction is a direction parallel to the surface of the substrate and vertical to the X direction. For the sake of viewability, wirings inside the semiconductor device 1 are omitted from FIG. 2.

The semiconductor device 1 includes a substrate 2, a support plate 30, a light receiving unit 40, adhesion layers 150 and 250, electrodes (pads) 70, 71, 72a, 72b, 73a, and 73b, and a sealant S. In the following description, in the structure of the substrate 2 and MOSFET 120a, the end side on which the MOSFET 120a is arranged will be referred to as the top end in the Z direction, and the end side on which the substrate 2 is arranged will be referred to as the bottom end in the Z direction.

The substrate 2 may be a circuit board formed of a bismaleimide triazine (BT) resin or a flexible substrate (flexible printed circuits or FPC) formed of polyimide.

The electrodes 70, 71, 72a, 72b, 73a, and 73b are provided on the top surface of the substrate 2, and may be a metallic foil containing copper (Cu). The electrodes 70 and 71 extend in the X direction. Each of the electrodes 70 and 71 has portions at their two ends in the X direction, whose Y-direction width is larger than the Y-direction width of the remaining portion that extends in the X direction. These wide portions of the electrodes 70 and 71 at the two ends in the X direction will be referred to as large end portions.

The MOSFETs 120a, 120b, 220a, and 220b are provided as separate chips.

The MOSFET 120a includes electrodes 121a and 122a, and an electrode arranged in the lower portion of the MOSFET 120a, which is not shown in FIG. 2. The electrode in the lower portion of the MOSFET 120a is in contact with the electrode 72a on the bottom surface of the MOSFET 120a with a conductive paste or the like interposed. The MOSFET 120a is therefore arranged on the top surface of the electrode 72a. The electrodes 121a and 122a are arranged on the top surface of the MOSFET 120a. The electrode arranged in the lower portion of the MOSFET 120a serves as a drain electrode of the MOSFET 120a. The electrode 121a serves as a source electrode of the MOSFET 120a, and the electrode 122a serves as a gate electrode of the MOSFET 120a. The electrode in the lower portion of the MOSFET 120a may have approximately the same size as the bottom surface of the MOSFET 120a.

The MOSFET 120b includes electrodes 121b and 122b, and an electrode arranged in the lower portion of the MOSFET 120b, which is not shown in FIG. 2. The electrode in the lower portion of the MOSFET 120b is in contact with the electrode 72b on the bottom surface of the MOSFET 120b with a conductive paste or the like interposed. The MOSFET 120b is therefore arranged on the top surface of the electrode 72b. The electrodes 121b and 122b are arranged on the top surface of the MOSFET 120b. The electrode in the lower portion of the MOSFET 120b serves as a drain electrode of the MOSFET 120b. The electrode 121b serves as a source electrode of the MOSFET 120b, and the electrode 122b serves as a gate electrode of the MOSFET 120b. The electrode in the lower portion of the MOSFET 120b may have approximately the same size as the bottom surface of the MOSFET 120b.

The MOSFET 220a includes electrodes 221a and 222a, and an electrode arranged in the lower portion of the MOSFET 220a, which is not shown in FIG. 2. The not-shown electrode in the lower portion of the MOSFET 220a is in contact with the electrode 73a on the bottom surface of the MOSFET 220a with a conductive paste or the like interposed. The MOSFET 220a is therefore arranged on the top surface of the electrode 73a. The electrodes 221a and 222a are arranged on the top surface of the MOSFET 220a. The electrode in the lower portion of the MOSFET 220a serves as a drain electrode of the MOSFET 220a. The electrode 221a serves as a source electrode of the MOSFET 220a, and the electrode 222a serves as a gate electrode of the MOSFET 220a. The electrode in the lower portion of the MOSFET 220a may have approximately the same size as the bottom surface of the MOSFET 220a.

The MOSFET 220b includes electrodes 221b and 222b, and an electrode arranged in the lower portion of the MOSFET 220b, which is not shown in FIG. 2. The electrode in the lower portion of the MOSFET 220b is in contact with the electrode 73b on the bottom surface of the MOSFET 220b with a conductive paste or the like interposed. In this manner, the MOSFET 220b is arranged on the top surface of the electrode 73b. The electrodes 221b and 222b are arranged on the top surface of the MOSFET 220b. The electrode in the lower portion of the MOSFET 220b serves as a drain electrode of the MOSFET 220b. The electrode 221b serves as a source electrode of the MOSFET 220b, and the electrode 222b serves as a gate electrode of the MOSFET 220b. The electrode in the lower portion of the MOSFET 220b may have approximately the same size as the bottom surface of the MOSFET 220b.

The MOSFETs 120a, 120b, 220b, and 220a may be aligned in this order in the X direction. When looking at the MOSFETs 120a and 220a, the side where the MOSFET 120a is arranged will be referred to as "one end" in the X direction, and the side where the MOSFET 220a is arranged will be referred to as "the other end" in the X direction.

In a manner similar to the electrodes 70, 71, 72a, 72b, 73a, and 73b, the support plate 30 is a metallic foil containing copper (Cu), for example. The support plate 30 may be a compound member of the metallic foil coated with an insulative paste or conductive paste. The support plate 30 is provided on the top surface of the substrate 2. The support plate 30 supports thereon the light receiving unit 40 as well as the light emitting elements 160 and 260. The support plate 30 is a plate extending in the X direction and Y direction.

The light receiving unit 40 is provided as a chip that includes the light receiving elements 140 and 240.

In the light receiving unit 40, the light receiving elements 140 and 240 are each arranged in contact with the top surface of the support plate 30. Each of the light receiving elements 140 and 240 of the light receiving unit 40 has a light receiving surface on its top surface.

The light receiving element 140 includes electrodes 141 to 144. The electrodes 141 to 144 are arranged on the top surface of the light receiving element 140. The electrodes 141 and 143 are electrically connected to each other, and the electrodes 142 and 144 are electrically connected to each other, for example inside the light receiving element 140, although these connections are not shown in FIG. 2. The electrodes 141 and 143 may each serve as a cathode electrode of the light receiving element 140, and the electrodes 142 and 144 may each serve as an anode electrode of the light receiving element 140.

The light receiving element 240 includes electrodes 241 to 244. The electrodes 241 to 244 are arranged on the top surface of the light receiving element 140. The electrodes 241 and 243 are electrically connected to each other, and the electrodes 242 and 244 are electrically connected to each other, for example inside the light receiving element 240, although these connections are not shown in FIG. 2. The electrodes 241 and 243 may each serve as a cathode electrode of the light receiving element 240, and the electrodes 242 and 244 may each serve as an anode electrode of the light receiving element 240.

The light emitting elements 160 and 260 are provided as separate chips.

The light emitting element 160 is arranged above the light receiving element 140, and the light emitting element 260 is arranged above the light receiving element 240. Each of the light emitting elements 160 and 260 has a light emitting surface on its bottom surface. The light emitting surface of the light emitting element 160 faces the light receiving surface of the light receiving element 140. The light emitting surface of the light emitting element 260 faces the light receiving surface of the light receiving element 240. The light emitting surface of each of the light emitting elements 160 and 260 is larger than the light receiving surface of the corresponding one of the light receiving elements 140 and 240. With such a configuration, even if the mounted light emitting element 160 is displaced from the position of the light receiving element 140, or even if the mounted light emitting element 260 is displaced from the position of the light receiving element 240, the light receiving element can be prevented from having its light receiving surface disposed partially outside of the light emitting surface of the light emitting element, when viewed from above. The stability of the charging current can be thereby enhanced.

The light emitting element 160 includes electrodes 161 and 162. The electrodes 161 and 162 are arranged on the top surface of the light emitting element 160. The electrode 161 may serve as a cathode electrode of the light emitting element 160, and the electrode 162 may serve as an anode electrode of the light emitting element 160.

The light emitting element 260 includes electrodes 261 and 262. The electrodes 261 and 262 are arranged on the top surface of the light emitting element 260. The electrode 261 may serve as a cathode electrode of the light emitting element 260, and the electrode 262 may serve as an anode electrode of the light emitting element 260.

An adhesion layer 150 is provided between the light emitting element 160 and light receiving element 140, and is arranged in contact with the light emitting element 160 and also with the light receiving element 140. Furthermore, an adhesion layer 250 is provided between the light emitting element 260 and light receiving element 240, and is arranged in contact with the light emitting element 260 and also with the light receiving element 240. Each of the adhesion layers 150 and 250 contains an insulative material that exhibits a light transmissivity to, for example, the light irradiated from the light emitting elements 160 and 260. In the light emitting elements 160 and 260, the light is irradiated from the upper portions of the light emitting elements through the lower portions of the light emitting elements that are base plates transparent with respect to the wavelength of the emitted light. The adhesion layers 150 and 250 may be an insulating film containing the insulative material. The adhesion layers 150 and 250 may be formed of an insulative paste that contains this insulative material. If the adhesion layers 150 and 250 are insulating films, their thickness can be increased in comparison with the adhesion layers 150 and 250 being formed of an insulative paste. For the sake of improved pressure resistance, the adhesion layers 150 and 250 formed of an insulating film are preferred.

The terminals 80, 81, 182a, 182b, 282a, and 282b are provided on the bottom surface of the substrate 2.

Signals are transmitted between the terminals 80 and 81 by a device and circuit that are not shown. The terminal 80 is electrically connected to the electrode 70 by way of a conductor (via hole) that penetrates the substrate 2 in the portion of the electrode 70 at the "other end" in the X direction, although it is not shown in FIG. 2. Furthermore, the terminal 81 is electrically connected to the electrode 71 by way of a conductor that penetrates the substrate 2 in the portion of the electrode 71 at "one end" in the X direction, although it is not shown in FIG. 2.

The terminals 182a, 182b, 282a, and 282b are respectively coupled to the circuits or the like provided outside the semiconductor device 1. The terminal 182a is electrically connected to an electrode arranged in the lower portion of the MOSFET 120a by way of a conductor that penetrates the substrate 2, the electrode 72a, and the conductive paste, although the connection is not shown in FIG. 2. The terminal 182b is electrically connected to an electrode arranged in the lower portion of the MOSFET 120b by way of a conductor that penetrates the substrate 2, the electrode 72b, and the conductive paste, although the connection is not shown in FIG. 2. The terminal 282a is electrically connected to an electrode arranged in the lower portion of the MOSFET 220a via a conductor that penetrates the substrate 2, the electrode 73a, and the conductive paste, although the connection is not shown in FIG. 2. The terminal 282b is electrically connected to an electrode arranged in the lower portion of the MOSFET 220b by way of a conductor that penetrates the substrate 2, the electrode 73b, and the conductive paste, although the connection is not shown in FIG. 2.

An arrangement may be such that each of the terminals 80, 81, 182a, 182b, 282a, and 282b is coupled to the corresponding one of the electrodes 70, 71, 72a, 72b, 73a, and 73b with the side surface of the substrate 2 covered in the Y direction, although such an arrangement is not shown in FIG. 2.

The sealant S is provided to cover the MOSFETs 120a, 120b, 220a, and 220b, support plate 30, light receiving unit 40, light emitting elements 160 and 260, and electrodes 70, 71, 72a, 72b, 73a, and 73b. The sealant S contains a non-translucent material. The non-translucent material may be an epoxy resin into which silicon carbide or carbon black is mixed. The sealant S thereby protects the semiconductor device 1, and prevents the light from escaping from between the relay units 100 and 200.

The light escape here includes optical crosstalk between the relay units 100 and 200, and escape from the light emitting elements 160 and 260 to the channels of the MOSFETs.

An optical crosstalk represents an escape of the irradiation light of the light emitting element 160 toward the light receiving surface of the light receiving element 240 and an escape of the irradiation light of the light emitting element 260 toward the light receiving surface of the light receiving element 140. By coating the portion of the light emitting element other than its light emitting bottom surface with a non-translucent material, an optical crosstalk can be avoided, and an inactive relay unit can be prevented from unintentionally becoming active.

The channel of a MOSFET may include a photosensitive portion. In such an arrangement, by preventing the light from escaping from the light emitting elements 160 and 260 to the channels of the MOSFETs, the MOSFETs in the ON or OFF state will not be unintentionally changed to the OFF or ON state.

The MOSFETs 120a, 120b, 220a, and 220b, support plate 30, light receiving unit 40, light emitting elements 160 and 260, and electrodes 70, 71, 72a, 72b, 73a, and 73b, which are sealed by the sealant S, will be arranged away from the edges of the package (or substrate 2) in the X direction and the edges of the package (or substrate 2) in the Y direction so that the sealant S will not come off.

Figure 3:
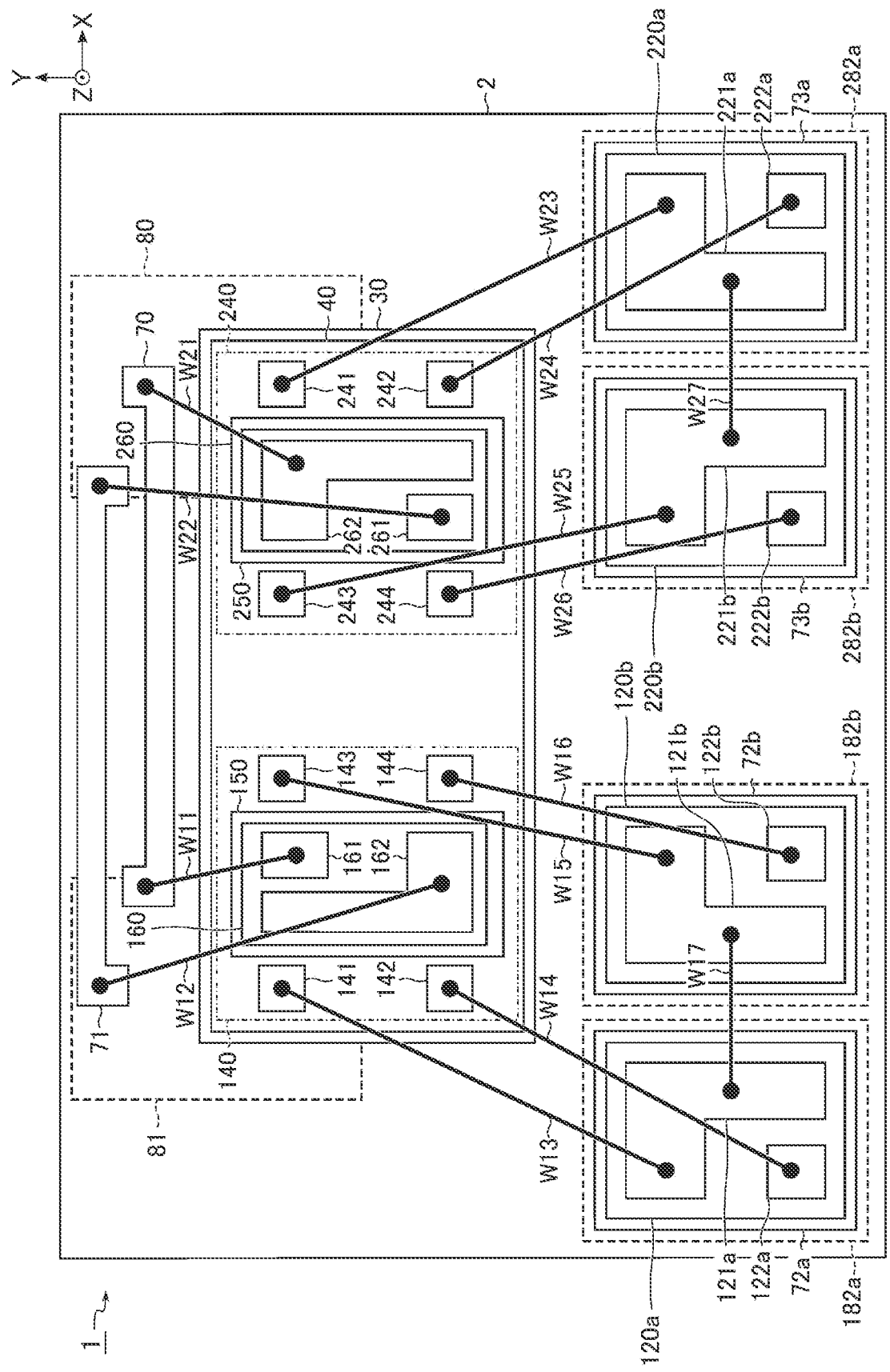
FIG. 3 is a plan view for showing an exemplary planar configuration of the semiconductor device according to the embodiment.

The electrical connections established in the semiconductor device 1 will be described with reference to FIG. 3. A plan view for an exemplary planar configuration of the semiconductor device according to the embodiment is presented in this drawing.

The semiconductor device 1 includes wirings W11, W12, W13, W14, W15, W16, W17, W21, W22, W23, W24, W25, W26, and W27.

The wirings W11 to W17 and W21 to W27 are wires formed by wire bonding. The wirings W11 to W17 and W21 to W27 are constituted by a conductive material.

The wiring W11 electrically connects the electrode 70 to the electrode 161. The wiring W12 electrically connects the electrode 71 to the electrode 162. The wiring W13 electrically connects the electrode 141 to the electrode 121a. The wiring W14 electrically connects the electrode 142 to the electrode 122a. The wiring W15 electrically connects the electrode 143 to the electrode 121b. The wiring W16 electrically connects the electrode 144 to the electrode 122b. The wiring W17 electrically connects the electrodes 121a and 121b. The wiring W21 electrically connects the electrode 70 to the electrode 262. The wiring W22 electrically connects the electrode 71 to the electrode 261. The wiring W23 electrically connects the electrode 241 to the electrode 221a. The wiring W24 electrically connects the electrode 242 to the electrode 222a. The wiring W25 electrically connects the electrode 243 to the electrode 221b. The wiring W26 electrically connects the electrode 244 to the electrode 222b. The wiring W27 electrically connects the electrodes 221a and 221b.

In the above configuration, the electrodes 70 and 71 function as a pair of common input terminals. In particular, one of the two large end portions of the electrode 70 is electrically connected directly to the cathode of the light emitting element 160, and one of the two large end portions of the electrode 71 is electrically connected directly to the anode of the light emitting element 160. Further, the other one of the two large end portions of the electrode 70 is electrically connected directly to the anode of the light emitting element 260, and the other one of the two large end portions of the electrode 71 is electrically connected directly to the cathode of the light emitting element 260. In this manner, a reverse connection is established between the light emitting element 160 and light emitting element 260. Such an arrangement switches the emission states of the light emitting elements 160 and 260 in an efficient and simultaneous manner. The electrodes 70 and 71 function as a pair of common input terminals to which complementary switching signals for the light emitting elements 160 and 260 are input and output. In this manner, the structural components can be reduced in comparison with a configuration in which a pair of input terminals corresponding to the cathode and anode of the light emitting element 160 and a pair of input terminals corresponding to the cathode and anode of the light emitting element 260 are separately provided. As a result, an increase in the dead time, an increase in the size of the semiconductor device 1, and an increase in production costs of the semiconductor device 1 can be suppressed, while the reliability of the semiconductor device 1 can be enhanced.

According to the embodiment, an increase in the dead time can be suppressed. In order to increase the operation speed, suppression of an increase in the dead time is preferred.

The semiconductor device 1 according to the embodiment includes a substrate 2, MOSFETs 120a, 120b, 220a, and 220b, light receiving elements 140 and 240, and light emitting elements 160 and 260. The light receiving element 140 turns the MOSFETs 120a and 120b to the ON state or OFF state in accordance with the emission state of the light emitting element 160. The light receiving element 240 turns the MOSFETs 220a and 220b to the ON state or OFF state in accordance with the emission state of the light emitting element 260. The light emitting elements 160 and 260 are configured such that either one of the light emitting elements 160 and 260 is in a lit state, while the other one is in an unlit state. In the semiconductor device 1 according to the embodiment, the MOSFETs 120a, 120b, 220a, and 220b are provided in contact with the top surface of the substrate 2. The light receiving elements 140 and 240 and light emitting elements 160 and 260 are arranged, when viewed from above, at positions that overlap the position of the substrate 2. In the above configuration of the semiconductor device 1, the MOSFETs 120a, 120b, 220a, and 220b, light receiving elements 140 and 240, and light emitting elements 160 and 260 are arranged in one package. Such a configuration can suppress variations in the elements and variations in the characteristics of the semiconductor device due to the arrangement of these elements. As a result, an increase in dead time can be suppressed.

The variations in elements here represent variations in the characteristic values of MOSFETs, characteristic values of light receiving elements, and characteristic values of light emitting elements. The variations in the characteristic values of MOSFETs may be differences between the characteristic values of MOSFETs included in one relay unit of the semiconductor device and the characteristic values of MOSFETs included in the other relay unit. The characteristic values of a MOSFET include a turn-on start time period at the time of supplying a charging current of a certain size to the MOSFET. The variations in the characteristic values of light receiving elements may be differences between the optical sensitivity of one light receiving element and that of the other light receiving element. In the following description, variations in the characteristic values of light receiving elements may also be simply referred to as variations in optical sensitivity. The variations in the characteristic values of the irradiation intensity of light emitting elements may be differences in irradiation intensity between one light emitting element and the other light emitting element. In the following description, variations in the characteristic values of light emitting elements may also be simply referred as variations in optical intensity.

Suppression in variations in the elements will be described in further detail. In the manufacturing process of the semiconductor device 1 according to the embodiment, adjacent chips of the same wafer can be used for MOSFETs 120a, 120b, 220a, and 220b in the same package. As in the MOSFETs 120a, 120b, 220a, and 220b, adjacent chips of the same wafer can be used for the light emitting elements 160 and 260. The light receiving elements 140 and 240 are included in the light receiving unit 40, which is formed as one chip. Such a configuration can suppress the variations in the characteristic values of MOSFETs, variations in the characteristic values of light emitting elements, variations in the characteristic values of light receiving elements, and variations in the characteristics of a semiconductor device due to the arrangement of elements.

Incidentally, for a semiconductor device that includes two relay units of different packages, it is very difficult to select adjacent chips of the same wafer for four MOSFETs, for two light receiving elements, or for two light emitting elements in the manufacturing process. In particular, in the process of mounting the two relay units on different substrates at different manufacturing steps, the two MOSFETs of the first relay unit are selected probably at a timing that differs from the timing for selecting the two MOSFETs of the second relay unit. It is therefore difficult to adopt adjacent MOSFETs from the same wafer for the two MOSFETs of the first relay unit and the two MOSFETs of the second relay unit. This makes it difficult to suppress variations in the characteristic values between the MOSFETs of the first relay unit and the MOSFETs of the second relay unit. For the same reason, with regard to the two light receiving elements and the two light emitting elements, suppression of variations in the characteristic values is difficult. In contrast, according to the present embodiment, two relay units are formed on the same substrate by mounting elements at the same step in the manufacturing process, which means that the four MOSFETs are likely to be selected from among MOSFETs of one or more wafers at the same timing. The four MOSFETs therefore can be selected from MOSFETs of the same wafer that are adjacent to one another. This can suppress variations in the characteristic values of the four MOSFETs. In the same manner, variations in the characteristic values can be suppressed for the light emitting elements 160 and 260. According to the embodiment, the light receiving elements 140 and 240 are included in the light receiving unit 40, which is provided as one chip. The light receiving elements 140 and 240 are therefore elements formed close to each other on the same wafer, as a result of which variations can be suppressed in the characteristic values of the light receiving elements 140 and 240.

An increase in dead time due to variations in elements will be described in relation to variations in optical intensity and variations in optical sensitivity. If the optical intensity and optical sensitivity vary widely, the range of variations in the charging current may also be widened. The variations in the charging current may indicate a difference between the charging currents that can be supplied to the two relay units in the semiconductor device. Even if the four MOSFETs of the semiconductor device have similar characteristic values, the variations in the charging current may result in the turn-on start time period of the MOSFETs in one of the relay units of the semiconductor device becoming longer than that of the MOSFETs in the other relay unit. This may lead to an increased dead time.

Figure 4:
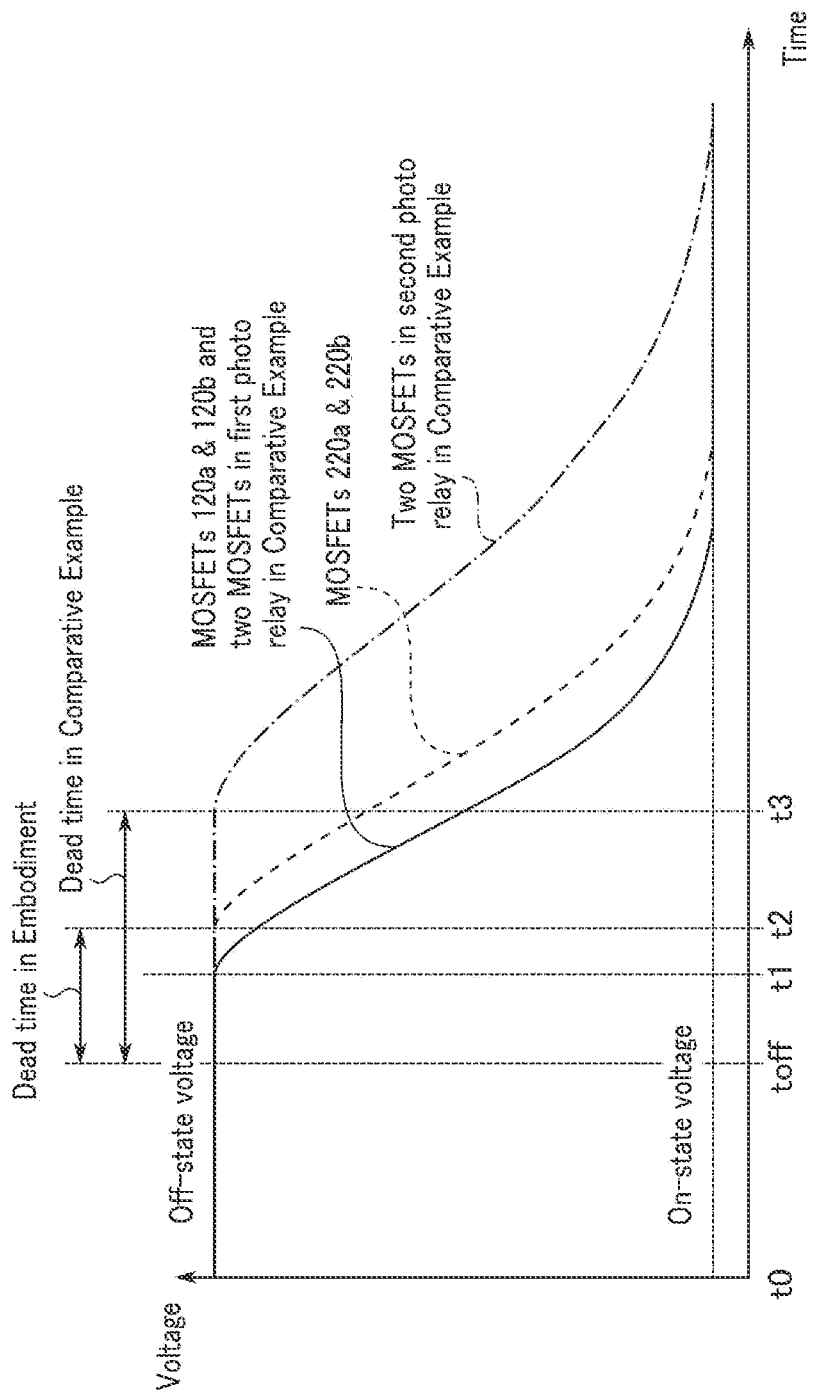
FIG. 4 is a chart showing a dead time in the semiconductor device according to the embodiment and in a semiconductor device according to a comparative example.

The increase in the dead time caused by the increase in variations of the charging current will be described in detail with reference to FIG. 4. A chart showing dead times in the semiconductor device 1 according to the embodiment and a semiconductor device according to a comparative example is presented in this drawing. The semiconductor device according to the comparative example is constituted by combining a first relay unit and a second relay unit, which are different packages. In the following description, the range of variations in the charging currents in the comparative example is wider than that in the embodiment. In FIG. 4, the vertical axis of the chart represents a drain-source voltage of each MOSFET, and the horizontal axis represents time. FIG. 4 indicates changes in the drain-source voltages when the MOSFETs 120a and 120b, and MOSFETs 220a and 220b, as well as the two MOSFETs of the first relay unit and two MOSFETs of the second relay unit in the comparative example, are switched from the OFF state to the ON state. These voltages are reflected in a voltage between the terminals 182a and 182b and a voltage between the terminals 282a and 282b. In FIG. 4, the supply of the charging current i to each of the MOSFETs starts at time t0. The four MOSFETs of the semiconductor device 1 according to the embodiment and the four MOSFETs of the semiconductor device according to the comparative example in FIG. 4 have similar properties.

According to the embodiment, variations in the optical sensitivity and optical intensity are suppressed so that each of the two charging current values can fit in the range of 95% or larger and 105% or smaller of the average value of the two charging currents. In one example, the value of the charging current in the relay unit 100 and the value of the charging current in the relay unit 200 are current values Ia and Ib (Ib=Ia×0.95/1.05). In a comparative example, the value of the charging current in the first relay unit and the value of the charging current in the second relay unit are Ia and Ic (Ic=Ia×0.8/1.2).

At time t0 in FIG. 4, the supply of the charging current to each relay unit corresponding to the relay unit starts in the embodiment and comparative example.

At time t1, the MOSFETs 120a and 120b according to the present embodiment and the two MOSFETs in the first relay unit according to the comparative example start changing from the OFF state to the ON state.

At time t2, the MOSFETs 220a and 220b according to the present embodiment start changing from the OFF state to the ON state.

At time t3, the two MOSFETs in the second relay unit according to the comparative example start changing from the OFF state to the ON state.

At time t0, when discharging starts at the gate of the ON-state MOSFET, this MOSFET changes from the ON state to the OFF state at time toff, where time toff is a time point earlier than time t1. That is, in the embodiment and comparative example, the turn-off time period is shorter than the turn-on start time period. The dead time may be obtained by subtracting the turn-off time period from the turn-on start time period.

In view of the above, according to the embodiment shown in FIG. 4, the dead time for turning the relay unit 200 from the inactive state to the active state can be defined as a time period between time toff and time t2. According to the comparative example, the dead time for turning the second relay unit from the inactive state to the active state can be defined as a time period between time toff and time t3. This shows that according to the embodiment, the dead time can be reduced in comparison with the comparative example. For instance, if the maximum rated drain-source voltage, rated drain current, and current value Ia of each MOSFET are 60 V, 1.2 A, and 36 µA, the dead time according to the present embodiment for turning the relay unit 200 from the inactive state to the active state may be 31.8 µs, whereas the dead time according to the comparative example for turning the second relay unit from the inactive state to the active state may be 57.7 µs. That means that, according to the present embodiment, the dead time can be reduced to 55% of the dead time according to the comparative example.

It is possible that an increase in the dead time may be caused by widened variations in the characteristic values of the MOSFETs. For instance, even if two semiconductor devices have MOSFETs whose average values of the characteristic values are the same between these MOSFETs, a semiconductor device having MOSFETs whose characteristic values vary more widely tends to have a longer dead time.

Furthermore, according to the present embodiment, the light receiving element 140 and light emitting element 160 are stacked with the adhesion layer 150 interposed, and the light receiving element 240 and light emitting element 260 are stacked with the adhesion layer 250 interposed. In such a stacked structure, with an insulative paste or insulating films, the distance between the light receiving element 140 and light emitting element 160 and the distance between the light receiving element 240 and light emitting element 260 will not have a large difference with respect to each other. In particular, if insulating films are adopted for the adhesion layers 150 and 250, the insulating films are prepared to have a uniform thickness so that a significant difference will not be observed between the distance between the light receiving element 140 and light emitting element 160 and the distance between the light receiving element 240 and light emitting element 260. If an insulative paste is adopted for the adhesion layers 150 and 250, these adhesion layers 150 and 250 may be formed by applying the same load at the same time upon the light emitting elements 160 and 260 having the same areas. The resultant adhesion layers 150 and 250 will have a uniform thickness. Thus, a difference between the distance between the light receiving element 140 and light emitting element 160 and the distance between the light receiving element 240 and light emitting element 260 can be reduced. If the light receiving unit 40 is provided as one chip including the light receiving elements 140 and 240, there will not be much difference in height between the light receiving elements 140 and 240. As a result, the symmetry between the adhesion layers 150 and 250 and the symmetry between the light emitting elements 160 and 260 can be improved. This can also reduce the difference between the light receiving element 140 and light emitting element 160 and the distance between the light receiving element 240 and light emitting element 260. As a result, the difference between the intensity of the light received by the light receiving element 140 and the intensity of the light received by the light receiving element 240 can be reduced, and the difference in efficiency of photoelectric conversion between the two relay units can be reduced.

According to the present embodiment, thermal dissipation of a semiconductor device can be improved by arranging a light receiving element and a light emitting element with an adhesion layer interposed. If opposing frames are adopted in a device, the light emitting element and light receiving element will face each other with a gap of several millimeters in-between, and the light emitting element and light receiving element may be enveloped by a resin of a low heat dissipation. In comparison with this structure using the opposing frames, the light receiving element according to the present embodiment is arranged closer to the light emitting element of a high thermal conductivity, with an adhesion layer interposed, where the thickness of this adhesion layer is smaller than the distance between the light emitting element and light receiving element in the structure using the opposing frames. Thus, in comparison with the structure with the opposing frames, the heat dissipation of the semiconductor device can be enhanced, and the properties of the light receiving element and light emitting element can be stabilized.

With the above stacked structure, the difference between the distance between the light receiving element 140 and light emitting element 160 and the distance between the light receiving element 240 and light emitting element 260 can be reduced, which prevents the two relay units from having non-uniform structures, or in other words having structures that are significantly different from each other. For instance, in the structure with opposing frames, the frame bending angles tend to differ, or the mounting positions of the light emitting element and light receiving element tend to be misaligned, as a result of which the structures of the two relay units tend to become non-uniform. With the above stacked structure of the present embodiment, however, a misalignment of the light emitting surface of the light emitting element and the light receiving surface of the opposing light receiving element, a difference in the angles formed by the light emitting surface and by the light receiving surface, a difference in the distances between the surfaces (in the Z direction), and displacement in the vertical direction (X-Y direction) can be reduced. Thus, the elements can be prevented from coming off from the resin, for example, when the interface between the resin and elements in the package is deformed under a thermal stress. This can also suppress time variations in the properties of the semiconductor device, which may be caused, for example, by light reflection on the interface between the adhesion layer and the low dielectric region (gap) in the optical path. According to the present embodiment, non-uniformity in the internal structures of the two relay units is suppressed so that failures in the semiconductor device and time variations in the properties of the semiconductor device can be reduced.

Furthermore, the light emitting elements 160 and 260 each have a light emitting surface of an area larger than the light receiving surface of the corresponding one of the light receiving elements 140 and 240. With such a configuration, even if the light receiving elements 140 and 240 are misaligned with the light emitting elements 160 and 260, the light emitting elements 160 and 260 having a larger light emitting surface than that of the light receiving element fully cover the light receiving elements 140 and 240. In comparison with a structure in which the light receiving surface of the light receiving element is equal to or smaller than the light emitting surface of the light emitting element, the light receiving elements 140 and 240 can be adhered respectively to the light emitting elements 160 and 260 with a larger light emitting surface. This prevents the electromotive force from being lowered. Moreover, because of the light emitting elements 160 and 260 and the light receiving elements 140 and 240 formed to have the above geometries, the light receiving surfaces of the light receiving elements 140 and 240 configured to generate the electromotive force are fully covered, and therefore variations in the electromotive force can be reduced. Thus, the efficiency of photoelectric conversion can be prevented from being lowered.

Furthermore, the light receiving unit 40 and light emitting elements 160 and 260 having a stacked structure can reduce the size of the package.

2. MODIFICATION EXAMPLES

A semiconductor device according to modification examples will be described next. In modifications described below, descriptions of configurations identical to those of the embodiment will be omitted, and the configurations that differ from the embodiment will be mainly discussed.

2.1 First Modification Example

In the configuration of the embodiment, the light receiving elements 140 and 240 are included in the light receiving unit 40, which is not a limitation. The light receiving elements 140 and 240 may be provided as separate chips.

The parts of the configuration of a semiconductor device 1 according to the first modification example that differ from the semiconductor device according to the embodiment will be mainly discussed.

The circuit configuration of the semiconductor device 1 according to the first modification example is similar to that of the embodiment. The configuration of the semiconductor device 1 according to the first modification example will be explained with reference to FIG. 5. A perspective diagram for an exemplary configuration of the semiconductor device according to the first modification example is presented in this drawing. As in FIG. 2, wirings are omitted from FIG. 5.

The semiconductor device 1 according to the first modification example includes support plates 130 and 230 in place of the support plate 30 according to the embodiment. As mentioned above, according to the first modification example, the light receiving elements 140 and 240 are provided as separate chips.

The support plates 130 and 230 are arranged on the top surface of the substrate 2. As is the support plate 30, the support plates 130 and 230 are metallic foils containing copper (Cu). Further, as with the support plate 30, the support plates 130 and 230 may be compound members of the metallic foils coated with an insulative paste or a conductive paste.

The support plate 130 supports the light receiving element 140 and light emitting element 160. The support plate 230 supports the light receiving element 240 and light emitting element 260. The support plates 130 and 230 may be conductors or insulators. Each of the support plates 130 and 230 is a plate extending in the X direction and Y direction.

Other structural elements are the same as those of the semiconductor device of the embodiment.

The first modification example produces effects similar to the embodiment.

In the first modification example, adjacent chips of the same wafer can be selected for the light receiving elements 140 and 240 in a manner similar to the MOSFETs 120*a*, 120*b*, 220*a*, and 220*b*, and light emitting elements 160 and 260 of the embodiment. Thus, variations in the characteristic values of the light receiving elements 140 and 240 can be reduced.

According to this modification example, each of the stacked structures that includes a light emitting element and a light receiving element may be coated with a resin having a small stress such as a silicon resin (transparent resin). Thereafter, a lightproof material such as an epoxy resin may be adopted for sealing and molding so as to produce a semiconductor device. In such a semiconductor device, the two light receiving elements are separated so that the two light emitting elements 160 and 260 can be arranged farther away from each other in comparison with the two light emitting elements 160 and 260 of the embodiment. In the first modification example adopting a silicon resin or the like to coat the stacked structures, the light that has passed through the stacked structure of the light emitting element 160 and the stacked structure of the light emitting element 260 can be prevented from leaking even if an infrared light having a high transmissibility to the silicon resin applied on the light emitting elements 160 and 260 is adopted as an irradiation light. In addition, according to the first modification example, in comparison with a light receiving element (light receiving unit) formed as one body such as one including two light receiving elements, possible propagation of infrared light through the light receiving elements can be suppressed. This can further reduce the generation of optical crosstalk between the two relay units.

2.2 Second Modification Example

In the above embodiment and first modification example, the light receiving unit 40 is positioned where it does not overlap the MOSFET 120*a*, 120*b*, 220*a*, or 220*b* when viewed from above, which is not a limitation. The light receiving unit 40 may be arranged on the MOSFETs.

The parts of the configuration of a semiconductor device 1 according to the second modification example that differ from the semiconductor devices according to the embodiment and the first modification example will be mainly discussed.

The circuit configuration of the semiconductor device 1 according to the second modification example is similar to that of the embodiment and the first modification example. The configuration of the semiconductor device 1 according to the second modification example will be explained with reference to FIG. 6. In this drawing, a perspective diagram for an exemplary configuration of the semiconductor device according to the second modification example is presented. As in FIGS. 2 and 5, wirings are omitted from FIG. 6.

In the second modification example, the light receiving unit 40 is arranged across two adjacent ones of the four MOSFETs 120*a*, 120*b*, 220*a*, and 220*b*. In the example of FIG. 6, the back surface of the light receiving unit 40 is in contact with the top surfaces of the MOSFET 120*b* and the MOSFET 220*b*. In particular, in the example of FIG. 6, the light receiving element 140 of the light receiving unit 40 is in contact with the top surface of the MOSFET 120*b*, and the light receiving element 240 of the light receiving unit 40 is in contact with the top surface of the MOSFET 220*b*.

FIG. 6 shows the light receiving unit 40 arranged on two adjacent MOSFETs, which is not a limitation. The light receiving unit 40 may be arranged on one of the four MOSFETs 120*a*, 120*b*, 220*a*, and 220*b*, or on three or more of the four MOSFETs 120*a*, 120*b*, 220*a*, and 220*b*.

The semiconductor device 1 in FIG. 6 does not include a support plate, which is not a limitation. The semiconductor device 1 according to the second modification example may include support plates as in the embodiment and the first modification example. If this is the case, the support plates may be arranged in contact with the top surface of the MOSFET 120*b*, the top surface of the MOSFET 220*b*, and the bottom surface of the light receiving unit 40. The support plates in this configuration are insulators.

Other structural components are the same as those of the semiconductor device of the embodiment.

The second modification example produces effects similar to the embodiment.

In the second modification example, the light receiving elements 140 and 240 are arranged between the MOSFETs and the corresponding light emitting elements 160 and 260, with respect to the Z direction. The light receiving elements 140 and 240 can thereby shield the channel of each MOSFET from the irradiation light emitted by the light emitting elements 160 and 260. With such a configuration, leakage of the light from the light emitting elements 160 and 260 to the channels of the MOSFETs can be avoided. As a result, the state of the MOSFETs can be prevented from being unintentionally changed, as mentioned earlier.

Furthermore, by stacking elements of three different types, the semiconductor device can be significantly downsized. This can promote reduction in the wiring length, symmetry of the wirings, and reduction in the capacity of the sealing resin. This also enhances heat resistance and heat dissipation, which improves the reliability of the semiconductor device.

2.3 Third Modification Example

In the configuration of the second modification example, the light receiving elements 140 and 240 are included in the light receiving unit 40, which is not a limitation. The light receiving elements 140 and 240 may be provided as separate chips as in the first modification example.

The part of the configuration of a semiconductor device 1 according to the third modification example that differ from the semiconductor devices according to the embodiment and the first and second modification examples will be mainly discussed below.

Figure 7:
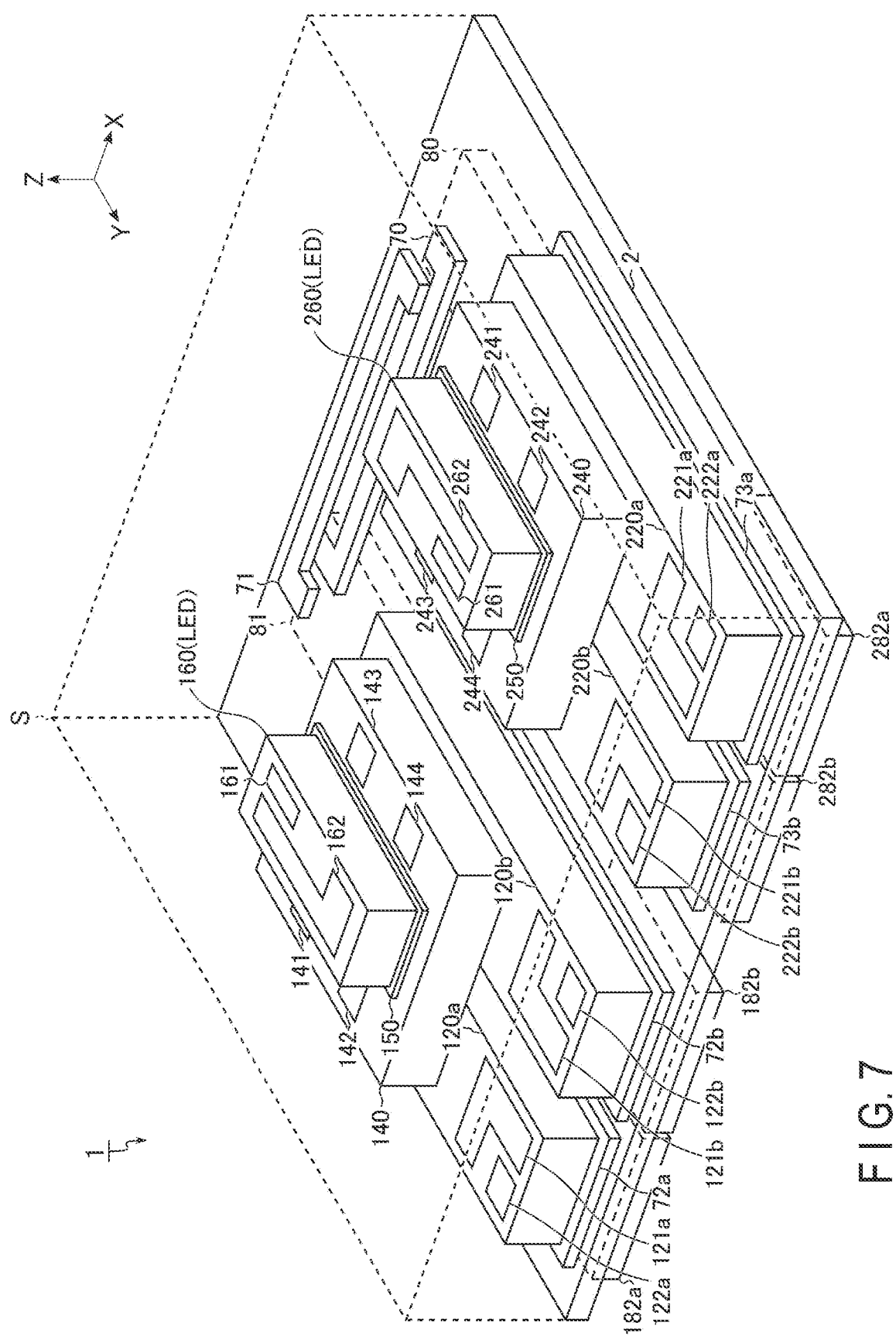
FIG. 7 is a perspective diagram showing an exemplary configuration of a semiconductor device according to the third modification example.

The circuit configuration of the semiconductor device 1 according to the third modification example is the same as that of the embodiment and the first and second modification examples. The configuration of the semiconductor device 1 according to the third modification example will be explained with reference to FIG. 7. In this drawing, a perspective diagram for an exemplary configuration of the semiconductor device according to the third modification example is presented. As in FIGS. 2, 5, and 6, wirings are omitted from FIG. 7.

In the third modification example, the light receiving elements 140 and 240 are provided as separate chips as in the semiconductor device according to the first modification example.

In the third modification example, the light receiving element 140 may be arranged on the MOSFETs 120a and 120b. In particular, the back surface of the light receiving element 140 is in contact with the top surfaces of the MOSFET 120a and MOSFET 120b. The back surface of the light receiving element 240 is in contact with the top surfaces of the MOSFET 220a and MOSFET 220b.

Other structural elements are the same as those of the semiconductor device of the second modification example.

The semiconductor device 1 according to the third modification example may include two support plates as in the semiconductor device according to the first modification example. One of the two support plates corresponding to the light receiving element 140 may be arranged in contact with the top surface of the MOSFET 120a, the top surface of the MOSFET 120b, and the bottom surface of the light receiving element 140. The other of the two support plates corresponding to the light receiving element 240 may be arranged in contact with the top surface of the MOSFET 220a, the top surface of the MOSFET 220b, and the bottom surface of the light receiving element 240. As in the second modification example, the support plates may be insulators.

The third modification example produces effects similar to the embodiment and the first and second modification examples.

Furthermore, by stacking elements of three different types, the reliability of the semiconductor device can be improved for the same reason as in the second modification example.

In this modification example, sealing and molding with an epoxy resin or the like can be performed after coating the stacked structures of the light emitting elements and light receiving elements with a silicon resin or the like. In this case, the two light emitting elements are positioned away from each other, and therefore even if an infrared ray having a high transmissibility to a silicon resin is adopted as the irradiation light of the light emitting elements 160 and 260, the irradiation light from the light emitting element of one of the adjacent relay units is prevented from leaking to the light receiving element of the other relay unit. Thus, the optical crosstalk between the two relay units can be reduced.

Furthermore, according to the third modification example, in addition to the improved symmetry in the arrangement of the elements of the semiconductor device, the shape and length of the wirings become more symmetric. This can improve the geometric stability at the time of resin sealing, while preventing the chips and wirings from coming off under stress of the sealed resin. As a result, the reliability of the semiconductor device 1 can be improved.

2.4 Fourth Modification Example

In the above embodiment and the first to third modification examples, the MOSFETs 120a, 120b, 220a, and 220b are provided as separate elements, which is not a limitation. The MOSFETs 120a and 120b may be provided as one chip, and the MOSFETs 220a and 220b may be provided as one chip.

The configuration of the semiconductor device 1 according to the fourth modification example will be described, focusing on differences with respect to the semiconductor device according to the embodiment and the first, second, and third modification examples.

The circuit configuration of the semiconductor device 1 according to the fourth modification example will be described with reference to FIG. 8. In this drawing, a circuit diagram for an exemplary circuit configuration of a semiconductor device according to the fourth modification example is presented.

In the fourth modification example, the semiconductor device 1 includes terminals 80, 81, 182a, 182b, 282a, and 282b, transistor units T1 and T2, light receiving elements 140 and 240, and light emitting elements 160 and 260. The light receiving element 140 includes light receiving elements 140-1 and 140-2. The light receiving element 240 includes light receiving elements 240-1 and 240-2. The transistor unit T1 includes MOSFETs 120a and 120b. The transistor unit T2 includes MOSFETs 220a and 220b.

The light receiving element 140-1 includes multiple photodiodes 140a-1 and a control circuit 140b-1. The number of photodiodes 140a-1 may be more than one and less than a hundred. The light receiving element 140-2 includes multiple photodiodes 140a-2 and a control circuit 140b-2. The number of photodiodes 140a-2 may be more than one and less than a hundred. The light receiving element 240-1 includes multiple photodiodes 240a-1 and a control circuit 240b-1. The number of photodiodes 240a-1 may be more than one and less than a hundred. The light receiving element 240-2 includes multiple photodiodes 240a-2 and a control circuit 240b-2. The number of photodiodes 240a-2 may be more than one and less than a hundred.

The gate of the MOSFET 120a is coupled to the anode electrode of the control circuit 140b-1. The drain of the MOSFET 120a is coupled to the drain of the MOSFET 120b. The source of the MOSFET 120a is coupled to the terminal 182a and the cathode electrode of the control circuit 140b-1. The gate of the MOSFET 120b is coupled to the anode electrode of the control circuit 140b-2. The source of the MOSFET 120b is coupled to the terminal 182b and the cathode electrode of the control circuit 140b-2.

The gate of the MOSFET 220a is coupled to the anode electrode of the control circuit 240b-1. The drain of the MOSFET 220a is coupled to the drain of the MOSFET 220b. The source of the MOSFET 220a is coupled to the terminal 282a and the cathode electrode of the control circuit 240b-1. The gate of the MOSFET 220b is coupled to the anode electrode of the control circuit 240b-2. The source of the MOSFET 220b is coupled to the terminal 282b and the cathode electrode of the control circuit 240b-2.

The rest of the configuration is the same as that of the embodiment, except for the light receiving elements 140 and 240 that are separately arranged.

Next, the configuration of the semiconductor device 1 according to the fourth modification example will be explained with reference to FIG. 9. In this drawing, a perspective diagram for an exemplary configuration of the semiconductor device according to the fourth modification example is presented. As in FIGS. 2, 5, 6 and 7, wirings are omitted from FIG. 9.

In the following description, the transistor unit T1 side of the arrangement including the transistor unit T1 and the light receiving element 140 will be referred to as one end side in the Y direction, and the light receiving element 140 side of this arrangement will be referred to as the other end side in the Y direction.

In the semiconductor device 1 according to the fourth modification example, the transistor unit T1 is provided as a chip that includes MOSFETs 120a and 120b. The transistor unit T2 is provided as a chip that includes MOSFETs 220a and 220b.

Figure 9:
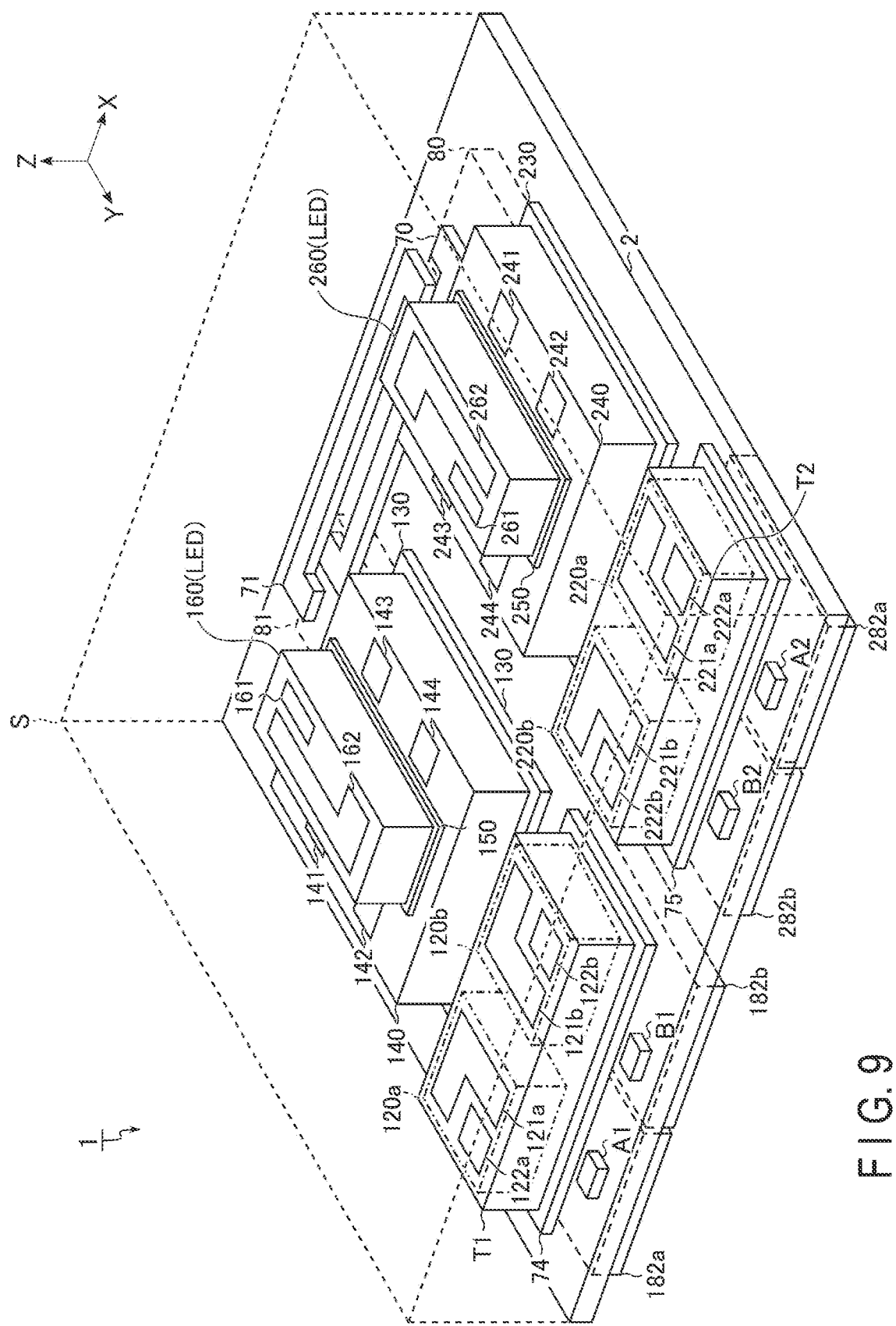
FIG. 9 is a perspective diagram showing an exemplary configuration of the semiconductor device according to the fourth modification example.

The transistor unit T1 includes, in place of the electrodes in the lower portions of the MOSFET 120a and MOSFET 120b in the embodiment, an electrode arranged in the lower portion of the transistor unit T1 and shared by the MOSFETs 120a and 120b, which is not shown in FIG. 9. The electrode serves as a combination of the drain of the MOSFET 120a and the drain of the MOSFET 120b.

The transistor unit T2 includes, in place of the electrodes in the lower portions of the MOSFET 220a and MOSFET 220b in the embodiment, an electrode arranged in the lower portion of the transistor unit T2 and shared by the MOSFETs 220a and 220b, which is not shown in FIG. 9. The electrode serves as a combination of the drain of the MOSFET 220a and the drain of the MOSFET 220b.

An electrode (pad) 74 is arranged between the transistor unit T1 and substrate 2. The electrode 74 is arranged in contact with the top surface of the substrate 2 and the bottom surface of the electrode in the lower portion of the transistor unit T1. The electrode 74 is electrically connected to the electrode in the lower portion of the transistor unit T1. The electrode (pad) 74 may be coupled to the electrode in the lower portion of the transistor unit T1 by way of an insulative or conductive paste that serves as a support.

An electrode (pad) 75 is arranged between the transistor unit T2 and substrate 2. The electrode 75 is arranged in contact with the top surface of the substrate 2 and the bottom surface of the electrode in the lower portion of the transistor unit T2. The electrode 75 is electrically connected to the electrode in the lower portion of the transistor unit T2. The electrode (pad) 75 may be coupled to the electrode in the lower portion of the transistor unit T2 by way of an insulative or conductive paste that serves as a support.

Electrodes (pads) A1 and B1 are provided on one end side of the top surface of the substrate 2 with respect to the electrode 74 in the Y direction.

The electrodes 74, A1, and B1 are arranged separately from one another.

Electrodes (pads) A2 and B2 are provided on one end side of the top surface of the substrate 2 with respect to the electrode 75 in the Y direction.

The electrodes 75, A2, and B2 are arranged separately from one another.

The electrode A1 is electrically connected to the terminal 182a via a conductor that penetrates the substrate 2, although it is not shown in FIG. 9. The electrode B1 is electrically connected to the terminal 182b via a conductor that penetrates the substrate 2, although it is not shown in FIG. 9. The electrode A2 is electrically connected to the terminal 282a via a conductor that penetrates the substrate 2, although it is not shown in FIG. 9. The electrode B2 is electrically connected to the terminal 282b via a conductor that penetrates the substrate 2, although it is not shown in FIG. 9.

The rest of the configuration in FIG. 9 is the same as that of the semiconductor device according to the first modification example.

Figure 10:
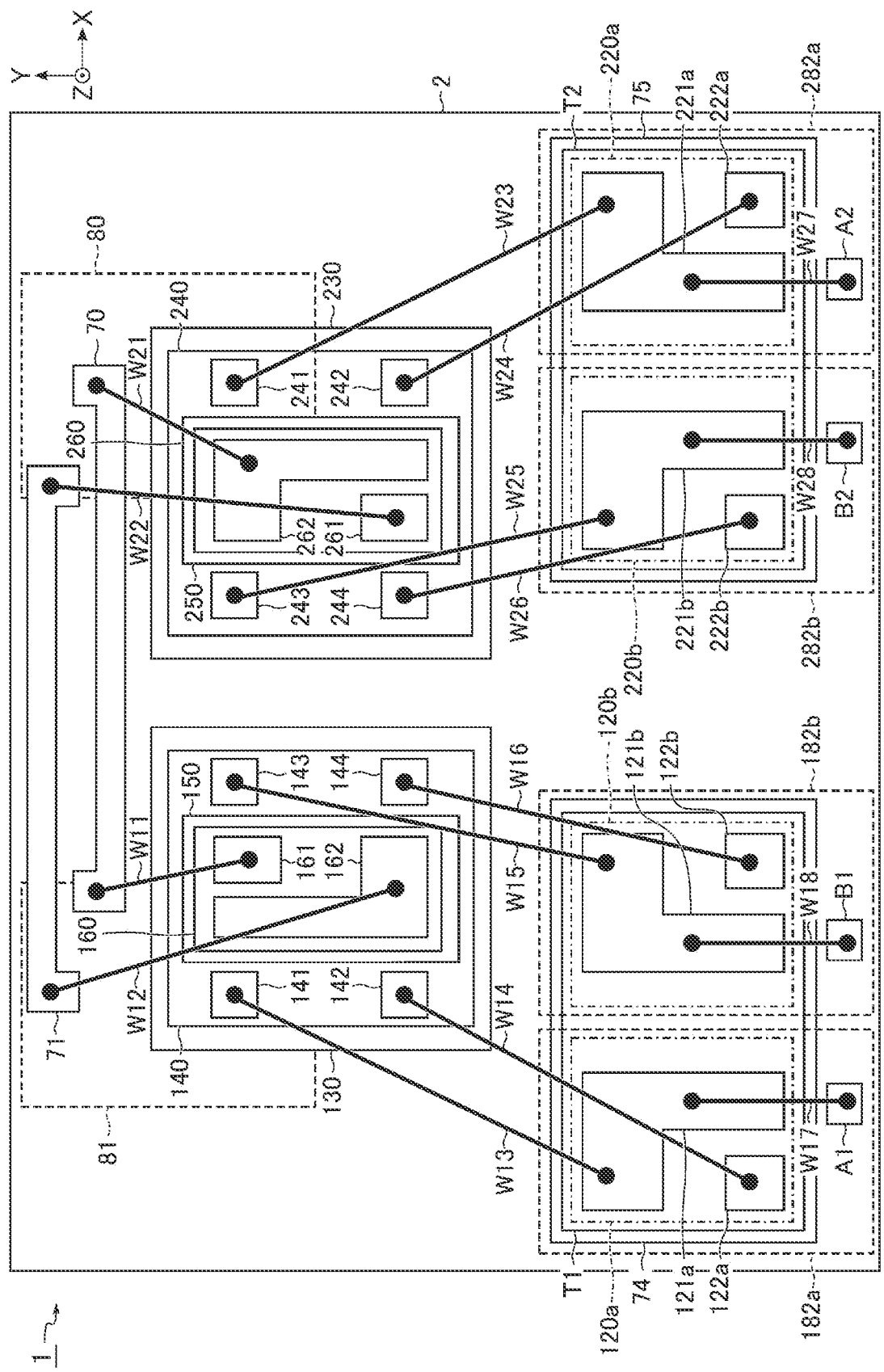
FIG. 10 is a plan view showing an exemplary planar configuration of the semiconductor device according to the fourth modification example.

The electrical connections in the semiconductor device 1 will be described with reference to FIG. 10. In this drawing, a plan view for an exemplary planar configuration of the semiconductor device according to the fourth modification example is presented.

The semiconductor device 1 includes wirings W17, W18, W27, and W28 in addition to the wirings W11 to W16 and W21 to W26.

The wirings W17, W18, W27, and W28 are formed of the same material as the wirings W11 to W16 and W21 to W26.

The wiring W17 electrically connects the electrode 121a to the electrode A1. The wiring W18 electrically connects the electrode 121b to the electrode B1. The wiring W27 electrically connects the electrode 221a to the electrode A2. The wiring W28 electrically connects the electrode 221b to the electrode B2.

With such a configuration, the electrodes 121a, 121b, 221a, and 221b are coupled to the terminals 182a, 182b, 282a, and 282b, respectively.

Other wiring connections are the same as those of the embodiment.

With such a configuration, the fourth modification example produces effects similar to the embodiment and the first modification example.

In the fourth modification example, the MOSFETs 120a and 120b are included in the same chip. This can reduce variations in the characteristic values of the MOSFETs 120a and 120b. Furthermore, the MOSFETs 220a and 220b are included in the same chip. This can reduce variations in the characteristic values of the MOSFETs 220a and 220b. For the same reason as in the embodiment, adjacent chips of the same wafer can be selected for the transistor units T1 and T2.

As in the third modification example, the light receiving element 140 may be arranged on the top surfaces of the MOSFETs 120a and 120b, and the light receiving elements 240 may be arranged on the top surfaces of the MOSFETs 220a and 220b, although such a configuration is not illustrated. In other words, elements of three different types may be stacked together. With such a configuration, the reliability of the semiconductor device can be improved for the same reason as in the second and third modification examples.

3. OTHER EXAMPLES

Figure 11:
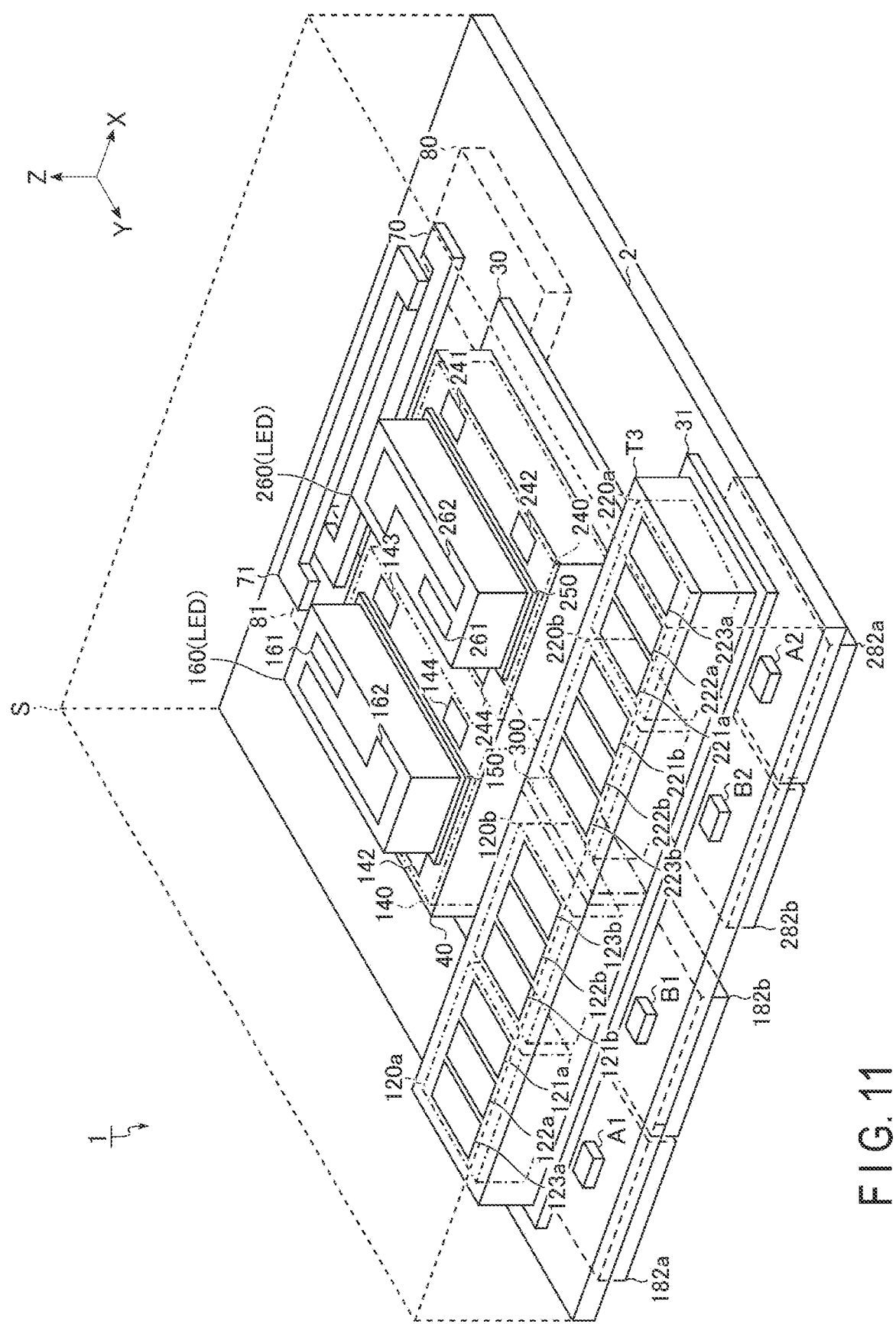
FIG. 11 is a perspective diagram showing an exemplary configuration of a semiconductor device according to another example.

In the above embodiment and modification examples, the source electrode and gate electrode are arranged on the top surface of a MOSFET, and a drain electrode is arranged on the bottom surface of the MOSFET. Such a MOSFET has a vertical structure. This is not a limitation, however, and as illustrated in FIG. 11, the MOSFET may have a lateral structure. In this drawing, a perspective diagram for an exemplary configuration of a semiconductor device 1 according to another example is presented. The semiconductor device 1 according to this example may include a support plate 31 and a transistor unit T3.

The circuit configuration of the semiconductor device 1 according to this example is the same as that of the embodiment as illustrated in FIG. 1. Alternatively, this circuit configuration may be the same as that of the fourth modification example as illustrated in FIG. 8.

The support plate 31 is provided on the top surface of the substrate 2. The transistor unit T3 is arranged on the top surface of the support plate 31. The support plate 31 is a compound member, for example, of a copper-containing metallic foil coated with an insulative paste. In this manner, the support plate 31 is electrically insulated from the transistor unit T3.

The transistor unit T3 is arranged as a chip including, for example, MOSFETs 120a, 120b, 220a, and 220b. In the processing process, the MOSFETs 120a, 120b, 220a, and 220b are formed in adjacent regions of the same wafer. The adjacent pairs of MOSFETs (i.e., the pair of MOSFETs 120a and 120b and pair of MOSFETs 220a and 220b) are electrically insulated from each other by providing a region such as an insulation layer 300 between these pairs. The pair of MOSFETs 120a and 120b and pair of MOSFETs 220a and 220b may be formed within a common well. In this example, the MOSFETs 120a, 120b, 220a, and 220b include electrodes 123a, 123b, 223a, and 223b, respectively, which function as their drains, on the top surface of the transistor unit T3. If the semiconductor device 1 according to this example has the same circuit configuration as that of the embodiment, the electrodes 123a, 123b, 223a, and 223b are electrically connected to the terminals 182a, 182b, 282a, and 282b by way of the electrodes A1, B1, A1, and B2, in the same manner as the electrodes 121a, 121b, 221a, and 221b according to the fourth modification example. The electrical connections of the wirings are the same as those of the embodiment, except for the connections between the electrode 123a and terminal 182a, between the electrode 123b and terminal 182b, between the electrode 223a and terminal 282a, and between the electrode 223b and terminal 282b. When the semiconductor device 1 according to this example has the same circuit configuration as that of the fourth modification example, the electrical connections of the wirings are the same as those of the fourth modification example, except that the electrodes 123a and 123b are mutually electrically connected and the electrodes 223a and 223b are mutually electrically connected. The electrodes 123a and 123b are electrically connected to each other, and the electrodes 223a and 223b are electrically connected to each other, by wirings or the like.

With such a configuration, effects similar to the embodiment can be produced. In this example, the MOSFETs 120a, 120b, 220a, and 220b are included in the same chip. This can suppress variations in the characteristic values of the MOSFETs 120a, 120b, 220a, and 220b.

The light receiving elements 140 and 240 may be arranged as separate chips as in the first modification example, although such an arrangement is not illustrated. This can further reduce the generation of optical crosstalk between two relay units as in the first modification example.

The light receiving unit 40 may be arranged on the MOSFETs as in the second modification example, although such an arrangement is not illustrated. In other words, the elements of three different types may be stacked together. This can improve the reliability of the semiconductor device for the same reason as in the second and third modification examples.

According to this example, the number of electrodes in each of the MOSFETs 120a, 120b, 220a, and 220b can be reduced, although such an arrangement is not illustrated. For instance, if the semiconductor device 1 according to the example has the same circuit configuration as that of the embodiment, the MOSFETs 120a and 120b may be configured to have the electrodes 121a and 121b that serve as a common source electrode, and the electrodes 122a and 122b that serve as a common gate electrode. Furthermore, the MOSFETs 220a and 220b may be configured to have one common source electrode for the electrodes 221a and 221b, and one common gate electrode for the electrodes 222a and 222b. The MOSFETs 120a, 120b, 220a, and 220b each have their own drains. That is, one drain is provided for each of the MOSFETs 120a, 120b, 220a, and 220b. In this arrangement, the electrodes 121a and 121b, the electrodes 122a and 122b, the electrodes 221a and 221b, and the electrodes 222a and 222b are electrically connected to each other with wirings that are not shown.

Alternatively, the electrodes 121a and 121b may be provided as a common electrode without using a wiring, and the electrodes 122a and 122b, the electrodes 221a and 221b, and the electrodes 222a and 222b may be provided respectively as common electrodes in a similar manner, although such a configuration is not shown. This can reduce the number of wirings, as a result of which the reliability of the semiconductor device can be improved. The production costs of the semiconductor device can also be reduced.

In FIG. 11, the MOSFETs 120a, 120b, 220a, and 220b are illustrated as being included in the transistor unit T3 provided as one chip, but this is not a limitation. The MOSFETs 120a, 120b, 220a, and 220b may be provided as separate chips.

Each of the electrodes 123a, 123b, 223a, and 223b is electrically connected to the corresponding one of the terminals 182a, 182b, 282a, and 282b, for example with wirings, corresponding electrodes arranged on the substrate 2, and conductors that penetrate the substrate 2, although such an arrangement is not shown in FIG. 11.

While certain embodiments have been described, these embodiments have been presented by way of example only, and are not intended to limit the scope of the inventions. Indeed, the novel embodiments described herein may be embodied in various other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
   a substrate;

a first transistor, a second transistor, a third transistor, and a fourth transistor arranged in contact with a first surface of the substrate;

a first light emitting element and a second light emitting element each arranged above the first surface of the substrate;

a first light receiving element arranged between the first surface of the substrate and the first light emitting element and configured to switch the first transistor and the second transistor to an ON state or to an OFF state in accordance with an emission state of the first light emitting element;

a second light receiving element arranged between the first surface of the substrate and the second light emitting element and configured to switch the third transistor and the fourth transistor to the ON state or to the OFF state in accordance with an emission state of the second light emitting element; and a first electrode and a second electrode arranged on the first surface of the substrate, wherein the first light emitting element and the second light emitting element are configured such that, when either one of the first light emitting element or the second light emitting element is turned to a lit state, the other one is turned to an unlit state, the first electrode and the second electrode extend in a first direction parallel to the first surface of the substrate, a first end portion of the first electrode at one end in the first direction and a second end portion of the first electrode at another end in the first direction have a wider width in a second direction than a remaining portion of the first electrode excluding the first end portion and the second end portion, the second direction intersecting the first direction in the first surface of the substrate, a third end portion of the second electrode at one end in the first direction and a fourth end portion of the second electrode at another end in the first direction have a wider width in the second direction than a remaining portion of the second electrode excluding the third end portion and the fourth end portion, the first end portion of the first electrode is coupled to an anode of the first light emitting element, the second end portion of the first electrode is coupled to a cathode of the second light emitting element, the third end portion of the second electrode is coupled to a cathode of the first light emitting element, and the fourth end portion of the second electrode is coupled to an anode of the second light emitting element.

2. The device of claim 1, wherein
the first transistor, the second transistor, the third transistor, the fourth transistor, the first light emitting element, the second light emitting element, the first light receiving element, and the second light receiving element are sealed with a sealant.

3. The device of claim 1, further comprising:
a first adhesion layer and a second adhesion layer, wherein
the first light emitting element is arranged above the first light receiving element in such a manner that a light emitting surface of the first light emitting element faces a light receiving surface of the first light receiving element, the second light emitting element is arranged above the second light receiving element in such a manner that a light emitting surface of the second light emitting element faces a light receiving surface of the second light receiving element, the first adhesion layer is arranged between the first light emitting element and the first light receiving element, in contact with the light emitting surface of the first light emitting element and the light receiving surface of the first light receiving element, and the second adhesion layer is arranged between the second light emitting element and the second light receiving element, in contact with the light emitting surface of the second light emitting element and the light receiving surface of the second light receiving element.

4. The device of claim 3, wherein
each of the first adhesion layer and the second adhesion layer is a light-transmissive insulating film.

5. The device of claim 3, wherein
the first light receiving element includes a portion arranged on a top surface of at least one of the first transistor and the second transistor, and the second light receiving element includes a portion arranged on a top surface of at least one of the third transistor and the fourth transistor.

6. The device of claim 1, wherein
the first transistor, the second transistor, the third transistor, and the fourth transistor are formed on one chip.

7. The device of claim 1, wherein
the first transistor and the second transistor are arranged on a first chip, and the third transistor and the fourth transistor are arranged on a second chip that differs from the first chip.

8. The device of claim 7, wherein
a drain of the first transistor and a drain of the second transistor are provided as a common first drain, and a drain of the third transistor and a drain of the fourth transistor are provided as a common second drain that differs from the first drain.

9. The device of claim 8, wherein
a source of the first transistor and a source of the second transistor are arranged in an upper portion of the first chip, a source of the third transistor and a source of the fourth transistor are arranged in an upper portion of the second chip, the first drain is arranged in a lower portion of the first chip, and the second drain is arranged in a lower portion of the second chip.

10. The device of claim 9, further comprising:
a first terminal, a second terminal, a third terminal, and a fourth terminal arranged beneath the substrate;

a third electrode, a fourth electrode, a fifth electrode, and a sixth electrode arranged on a top surface of the substrate;

a first conductor penetrating the substrate and configured to mutually couple the first terminal and the third electrode;

a second conductor penetrating the substrate and configured to mutually couple the second terminal and the fourth electrode;

a third conductor penetrating the substrate and configured to mutually couple the third terminal and the fifth electrode; and a fourth conductor penetrating the substrate and configured to mutually couple the fourth terminal and the sixth electrode, wherein the source of the first transistor is coupled to the third electrode by way of a wiring, the source of the second transistor is coupled to the fourth electrode by way of a wiring, the source of the third transistor is coupled to the fifth electrode by way of a wiring, and the source of the fourth transistor is coupled to the sixth electrode by way of a wiring.

11. The device of claim 1, wherein
the first light receiving element and the second light receiving element are arranged on one chip.

12. The device of claim 1, wherein
a source of the first transistor and a source of the second transistor are commonly coupled to the first light receiving element, and
a source of the third transistor and a source of the fourth transistor are commonly coupled to the second light receiving element.

13. The device of claim 12, further comprising:
a first terminal, a second terminal, a third terminal, and a fourth terminal arranged beneath the substrate, wherein
a drain of the first transistor is arranged in a lower portion of the first transistor,
a drain of the second transistor is arranged in a lower portion of the second transistor,
a drain of the third transistor is arranged in a lower portion of the third transistor,
a drain of the fourth transistor is arranged in a lower portion of the fourth transistor, and
the drain of the first transistor, the drain of the second transistor, the drain of the third transistor, and the drain of the fourth transistor are coupled to the first terminal, the second terminal, the third terminal, and the fourth terminal, respectively, via a conductor that penetrates the substrate.

14. The device of claim 1, wherein
the first transistor, the second transistor, the third transistor, and the fourth transistor are provided as separate chips.

15. The device of claim 2, wherein
the sealant contains a non-translucent material.

16. The device of claim 1, further comprising:
a first terminal and a second terminal arranged beneath the substrate, wherein
the first terminal is arranged in the first end portion so as to be coupled to the first electrode via a conductor that penetrates the substrate, and
the second terminal is arranged in the fourth end portion so as to be coupled to the second electrode via a conductor that penetrates the substrate.

* * * * *